United States Patent [19]
Koga

[11] Patent Number: 5,399,895
[45] Date of Patent: Mar. 21, 1995

[54] SEMICONDUCTOR DEVICE AND METHOD OF MANUFACTURING THEREOF

[75] Inventor: Tsuyoshi Koga, Hyogo, Japan

[73] Assignee: Mitsubishi Denki Kabushiki Kaisha, Tokyo, Japan

[21] Appl. No.: 198,075

[22] Filed: Feb. 17, 1994

[30] Foreign Application Priority Data

Mar. 23, 1993 [JP] Japan .................. 5-063946
Nov. 10, 1993 [JP] Japan .................. 5-281450

[51] Int. Cl.⁶ .................. H01L 27/04; H01L 21/265
[52] U.S. Cl. .................. 257/372; 257/376; 257/399; 257/375; 257/519; 437/40; 437/63
[58] Field of Search ............... 257/372, 375, 376, 519, 257/399; 437/40, 63

[56] References Cited

U.S. PATENT DOCUMENTS 5,160,996  11/1992  Odanaka ................... 257/376

FOREIGN PATENT DOCUMENTS

| | | |
|---|---|---|
| 60-180158 | 2/1984 | Japan . |
| 61-114552 | 6/1986 | Japan . |
| 62-123736 | 6/1987 | Japan . |
| 62-204566 | 9/1987 | Japan . |
| 62-298130 | 12/1987 | Japan . |
| 1-138730 | 3/1989 | Japan . |
| 2-37767 | 2/1990 | Japan . |
| 3-187258 | 8/1991 | Japan . |
| 4-68564 | 3/1992 | Japan . |

*Primary Examiner*—Edward Wojciechowicz
*Attorney, Agent, or Firm*—Lowe, Price, LeBlanc & Becker

[57] ABSTRACT

A LOCOS oxide film is provided in a main surface of a semiconductor substrate for isolating an element region from another element region. A channel cut layer formed of a P-type impurity is provided under the element region. A P⁺ impurity region having a concentration thicker than that of P-type impurity of channel cut layer is formed directly under a bird's beak portion of LOCOS oxide film in the main surface of semiconductor substrate. Therefore, an isolation breakdown voltage of an N-channel transistor region is increased.

7 Claims, 35 Drawing Sheets

SEMICONDUCTOR DEVICE AND METHOD OF MANUFACTURING THEREOF

BACKGROUND OF THE INVENTION

1. Field of the Invention

The present invention generally relates to semiconductor devices, and more particularly to a semiconductor device which is improved to increase an isolation breakdown voltage of an N-channel transistor. The present invention also relates to a method of manufacturing such semiconductor device. This invention further relates to a semiconductor device including an N-channel field transistor having an improved breakdown voltage.

2. Description of the Prior Art

Among semiconductor memory devices, a DRAM which allows random input/output of memory information is known. Generally, a DRAM includes a memory cell array which is a memory region storing a large amount of memory information and a peripheral circuitry which is required for external input/output.

FIG. 40 is a block diagram showing a structure of a general DRAM. In FIG. 40, a DRAM 50 includes a memory cell array 51 storing data signals of the memory information. A row and column address buffer 52 is provided only for receiving an external address signal for selecting a memory cell constituting a unit memory circuit. An input protection circuit 59 is connected to row and column address buffer 52, and an address signal is passed to row and column address buffer 52 through input protection circuit 59. A row decoder 53 and a column decoder 54 designate a memory cell by decoding the address signal. A sense refresh amplifier 55 amplifies and reads a signal stored in the designated memory cell. A data in buffer 56 and a data out buffer 57 are provided for data input/output. A clock generator 58 is provided for generating clock signals.

The present invention relates to an N-channel transistor in a memory cell array and a high breakdown voltage transistor input protection circuit 59.

FIGS. 41–51 are cross sectional views of a semiconductor device in respective steps of a manufacturing process of a conventional CMOS field effect transistor.

Referring to FIG. 41, a field oxide film 2 is formed for isolation through the LOCOS method at a main surface of a silicon substrate 1.

Referring to FIG. 42, a P-channel transistor region 3 is covered with a resist 4, and boron 6 is implanted into an N-channel transistor region 5 for forming a well under conditions of implantation energy: 1 Mev and implantation concentration: $1 \times 10^{13}$ atoms/cm$^2$. Boron 7 is implanted for a channel cut of field oxide film 2 under conditions of implantation energy: 150 KeV and implantation concentration: $5 \times 10^{12}$ atoms/cm$^2$. Then, boron 8 doped for a channel is implanted for determining $V_{th}$ of the N-channel transistor under conditions of implantation energy: 50 KeV and implantation concentration: $3 \times 10^{12}$ atoms/cm$^2$.

Referring to FIG. 43, N-channel transistor region 5 is covered with a resist 9, and phosphorus 10 is implanted into P-channel transistor region 3 for forming a well under conditions of implantation energy: 1.2 MeV and implantation concentration: $1 \times 10^{13}$ atoms/cm$^2$. Boron 11 doped for a channel is implanted for determining $V_{th}$ of the P-channel transistor under conditions of implantation energy: 20 KeV and implantation concentration: $1 \times 10^{12}$ atoms/cm$^2$.

Referring to FIG. 44, a silicon oxide film 12 having a film thickness of about 150Å, a phosphorus-doped polycrystalline silicon film 13, and a tungsten silicide film 14 are formed in turn, and thus a gate electrode 15 of a MOS transistor is formed. A portion where boron 7 is implanted will be called a channel cut layer 7a (concentration: $1 \times 10^{16}$–$5 \times 10^{16}$ atoms/cm$^3$) hereinafter.

Referring to FIG. 45, P-channel transistor region 3 is covered with a resist 16, and phosphorus 18 is implanted rotationally at an inclination of 45° into a source/drain region 17 of the N-channel transistor under conditions of implantation energy: 50 KeV and implantation concentration: $2 \times 10^{13}$ atoms/cm$^2$.

Referring to FIG. 46, N-channel transistor region 5 is covered with a resist 19, and boron difluoride 21 is implanted into source/drain regions 20 of the P-channel transistor under conditions of implantation energy: 20 KeV and implantation concentration: $1 \times 10^{13}$ atoms/cm$^2$.

Referring to FIG. 47, a sidewall spacer 22 is formed by the silicon oxide film on a sidewall of gate electrode 15. Then, P-channel transistor region 3 is covered with a resist 23, and arsenic 24 is implanted into source/drain regions 17 of the N-channel transistor under conditions of implantation energy: 50 KeV and implantation concentration: $5 \times 10^{15}$ atoms/cm$^2$.

Referring to FIG. 48, N-channel transistor region 5 is covered with a resist 25, and boron difluoride 26 is implanted into source/drain regions 20 of the P-channel transistor under conditions of implantation energy: 20 KeV and implantation concentration: $5 \times 10^{15}$ atoms/cm$^2$. Then, drive treatment (i.e., heat treatment) was conducted for about twenty minutes under $O_2$ atmosphere at 850° C.

Referring to FIG. 49(a), portions other than the ROM implantation portion (shown in FIG. 49(b)) is covered with a resist 27.

Referring to FIG. 50(a), boron 28 is implanted for ROM determination (with an acceleration voltage of 300 KeV). Thus, ions for writing data (i.e., programming) are implanted into the ROM implantation portion (shown in FIG. 50(b)).

The description of the ROM implantation will be given for reference. ROM is a memory allowing accesses to certain addresses at an arbitrary order, and reading is the main or only operation carried out therein. The above-described ion-implantation program is known as a method for writing data (programming). Referring to FIG. 50(b), by implanting channel ions (28) using ion-implantation mask (27), a threshold voltage of a memory cell transistor 100 is changed such that the data is programmed.

Resist 27 is removed after ROM implantation.

Referring to FIG. 51, an interlayer insulating film 29 is formed on silicon substrate 1 for covering the gate electrode. A contact hole is formed in interlayer insulating film 29 for exposing a surface of the source/drain region, and an electrode 30 is connected to the source/drain region through this contact hole.

Since the conventional semiconductor device has been manufactured by the above-described method, the following problems exist.

FIG. 52 is a profile of a boron concentration in the silicon substrate (i.e., a relationship between depth of the substrate and concentration of boron) taken along line A—A in FIG. 44.

Referring to FIGS. 42, 44, and 52, in the conventional method, boron 7 is implanted deeply with a high energy for a channel cut of the N-channel transistor, and then thermally diffused for forming channel cut layer 7a. At this time, since boron is diffused down under an end 2a of silicon oxide film 2, the concentration of boron is lowered directly under end 2a of silicon substrate 2 (approximately $1 \times 10^{16}$–$5 \times 10^{16}$ atoms/cm$^3$ at portion "a" in FIG. 52), and thus the isolation breakdown voltage is decreased.

Also, in the conventional method, the breakdown voltage of the N-channel field transistor (i.e., a high breakdown voltage transistor), which is formed simultaneously with the N-channel transistor, is decreased.

The high breakdown voltage transistor serves to form input protection circuit 59, referring to FIG. 40.

The input protection circuit is provided between a pad and an address buffer, referring to FIG. 53. Input protection circuit 59 includes the N-channel field transistor and the P-channel field transistor, and serves to release noise of input signals externally.

FIG. 54 is a cross sectional view of the N-channel field transistor formed in the input protection circuit. Although the N-channel field transistor 115 shown in FIG. 54 is formed spaced apart from the transistor shown in FIG. 51, they are still formed within the same chip. In FIGS. 51 and 54, portions shown by the same hatching are formed simultaneously.

Referring to FIG. 54, gate electrode 15 consisting of polycrystalline silicon film 13 and tungsten silicide film 14 is formed on field oxide film 2. Field oxide film 2 under gate electrode 15 is thick, and a transistor thus formed is also called a high breakdown voltage transistor.

In FIG. 54, a profile of boron in silicon substrate 1 cut along line A—A is the same as that shown in FIG. 52. The concentration of boron is lowered directly under end 2a of silicon oxide film 2, and accordingly the breakdown voltage of the N-channel field transistor 115 is decreased. Then, a leak current flows to the direction shown by an arrow B, so that it cannot perform its function as an input protection circuit.

SUMMARY OF THE INVENTION

The present invention was made to solve the above described problems, and its object is to provide a semiconductor device which improves an isolation breakdown voltage of an N-channel transistor.

Another object of the present invention is to provide a semiconductor device which provides a breakdown voltage of an N-channel field transistor.

The present invention is also for providing a method of manufacturing such semiconductor device.

A semiconductor device according to the present invention includes a semiconductor substrate having a main surface. A LOCOS oxide film for surrounding an element region and isolating the element region from another element region is provided in the main surface of the semiconductor substrate. The device includes an N-channel transistor provided in the element region. The LOCOS oxide film includes a bird's beak portion. A channel cut layer having a P-type impurity implanted therein is provided under the element region. A P+ impurity region having a concentration thicker than that of P-type impurity of the channel cut layer is formed directly under the bird's beak portion of the LOCOS oxide film in the main surface of the semiconductor substrate.

A semiconductor device according to the second aspect of the present invention relates to a semiconductor device including an N-channel field transistor for forming an input protection circuit. The device includes a semiconductor substrate, a pair of N-type impurity regions formed spaced apart from each other in the main surface of the semiconductor substrate, and a LOCOS oxide film having a bird's beak portion for surrounding and isolating the pair of N-type impurity regions. A gate electrode is provided on the LOCOS oxide film so as to bridge the pair of N-type impurity regions. A channel cut layer having a P-type impurity implanted therein is provided under the element region. A P+ impurity region having a concentration thicker than that of P-type impurity of the channel cut layer is formed directly under the bird's beak portion of the LOCOS oxide film in the main surface of the semiconductor substrate.

A method of manufacturing a semiconductor device according to the third aspect of the present invention relates to a manufacturing method of a semiconductor device including an N-channel transistor and a P-channel transistor. First, a LOCOS oxide film including a bird's beak portion is formed in the main surface of the semiconductor substrate. First P-type impurity ions for channel doping are implanted into the main surface of the semiconductor substrate within the element region. Second P-type impurity ions for forming a channel cut layer under the element region are implanted into the main surface of the semiconductor substrate. The N-channel transistor is formed on the semiconductor substrate within the element region. Third P-type impurity ions are implanted for forming P-type source/drain regions of the P-channel transistor at positions isolated from the element region in the main surface of the semiconductor substrate. Fourth P-type impurity ions for ROM determination are implanted into the main surface of the semiconductor substrate. A P+ impurity region having a concentration thicker than that of P-type impurity region of the channel cut layer is formed directly under the bird's beak portion of the LOCOS oxide film.

In the semiconductor device according to the first aspect of the present invention, an isolation breakdown voltage of the n-channel transistor is improved, because the P+ impurity region having a concentration thicker than that of P-type impurity of the channel cut layer is formed directly under the bird's beak portion of the LOCOS oxide film in the main surface of the semiconductor substrate.

In the semiconductor device according to the second aspect of the present invention, a breakdown voltage of the N-channel field transistor is improved, because the P+ impurity region having a concentration thicker than that of P-type impurity of the channel cut layer is formed directly under the bird's beak portion of the LOCOS oxide film in the main surface of the semiconductor substrate of the semiconductor device including the N-channel field transistor for forming the input production circuit.

In the manufacturing method of the semiconductor device according to the third aspect of the present invention, the N-channel transistor having an improved isolation breakdown voltage can be obtained, because the P+ impurity region having a concentration thicker than that of P-type impurity of the channel cut layer is formed directly under the bird's beak portion of the LOCOS oxide film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
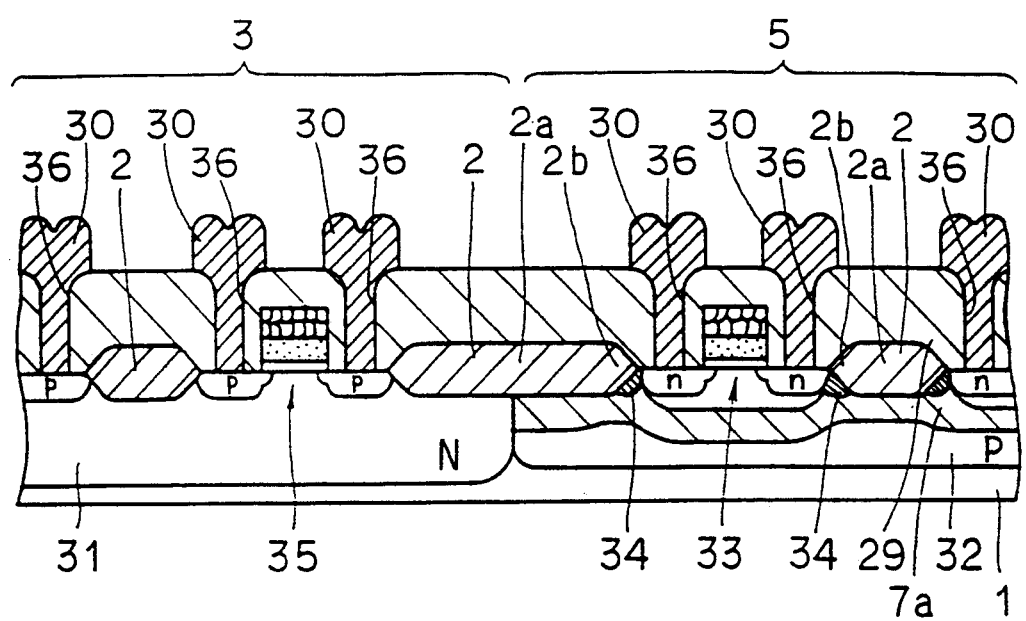
FIG. 1 is a cross sectional view of a semiconductor device according to one embodiment of the present invention.

One embodiment of the present invention will be described referring to the drawings.

EXAMPLE 1

FIG. 1 is a sectional view of a semiconductor device according to one embodiment of the present invention. Referring to FIG. 1, an N-well 31 and a P-well 32 are provided adjacent to each other in a main surface of a silicon substrate 1. An N-channel transistor 33 is formed in P-well 32. A P-channel transistor 35 is formed in N-well 31. A field oxide film 2 is provided in an N-channel transistor region 5 for surrounding an element region for forming N-channel transistor 33 and isolating the element region from other element regions. Field oxide film 2 is formed including a body portion 2a having a substantially constant film from thickness, and a surrounding portion 2b formed integrally with the body portion 2a for surrounding directly the periphery of the element region and having its film thickness gradually decreased from the body portion 2a to the element region. A P+ impurity region 34 having a P-type impurity concentration selected within the range of $1 \times 10^{17}$–$5 \times 10^{17}$ atoms/cm$^2$ is formed directly under surrounding portion 2b of field oxide film 2 in the main surface of silicon substrate 1. A channel cut layer 7a (concentration: $1 \times 10^{16}$–$5 \times 10^{16}$ atoms/cm$^3$) formed of the p-type impurity is provided under the element region. P-channel transistor 35 is provided in a P-channel transistor region 3. An interlayer insulating film 29 is provided on silicon substrate 1 for covering N-channel transistor 33 and P-channel transistor 35. A contact hole 36 is provided within interlayer insulating film 29 for exposing respective source/drain regions of N-channel transistor 33 and P-channel transistor 35. An electrode 30 is connected to the source/drain region through contact hole 36.

In the present embodiment, P+ impurity region 34 having the P-type impurity concentration selected within the range of $1 \times 10^{17}$–$5 \times 10^{17}$ atoms/cm$^3$ is provided directly under surrounding portion 2b of field oxide film 2. As a result, concentration of the P-type impurity will be increased therein and an element isolation breakdown voltage will be increased.

A method of manufacturing the semiconductor device shown in FIG. 1 will be described below.

FIGS. 2–11 are cross sectional views of the semiconductor device in respective steps of a manufacturing method of the semiconductor device shown in FIG. 1.

Figure 2:
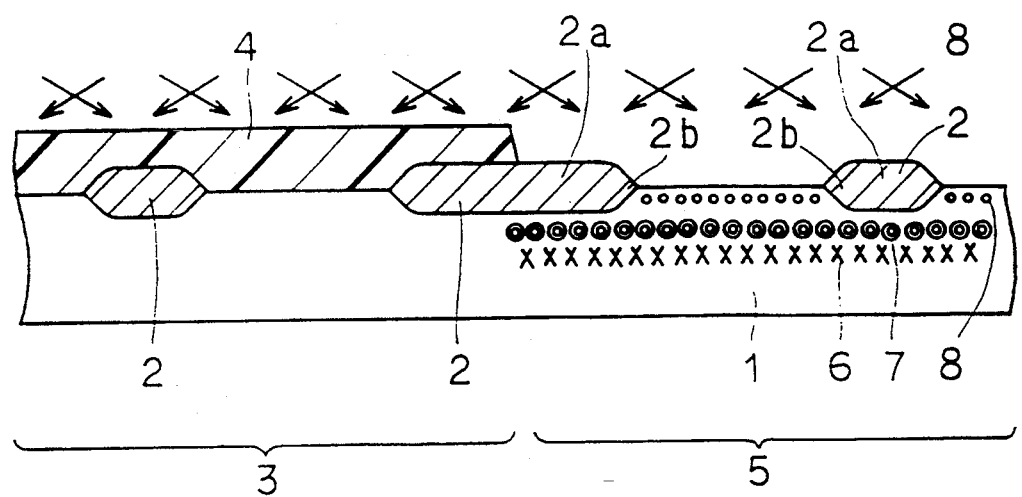
FIG. 2 is a cross sectional view of the semiconductor device in a first step of a first manufacturing method of the semiconductor device shown in FIG. 1.

Referring to FIG. 2, a silicon oxide film 2 is formed through LOCOS method at a main surface of a silicon substrate 1 for isolation. Field oxide film 2 is formed including a body portion 2a having a substantially constant film thickness, and a surrounding portion 2b formed integrally with body portion 2a for directly surrounding the periphery of an element region and having its film thickness gradually decreased from body portion 2a to the element region.

P-channel transistor region 3 is covered with a resist 4, and boron 6 is implanted into an N-channel transistor region 5 for forming a well under conditions of implantation energy: 1 MeV and implantation concentration: $1 \times 10^{13}$ atoms/cm$^2$. Boron 7 for a channel cut of silicon oxide film 2 is implanted into the substrate with implantation energy of 150 KeV and implantation concentration of $5 \times 10^{12}$ atoms/cm$^2$, so as to obtain the final concentration of $1 \times 10^{16}$–$5 \times 10$ atoms/cm$^3$. Boron 8 doped for a channel is implanted rotationally at an inclination of 45° for determining a threshold voltage Vth of the N-channel transistor under conditions of implantation energy: 50 KeV and implantation concentration: $3 \times 10^{12}$ atoms/cm$^2$.

Figure 12:
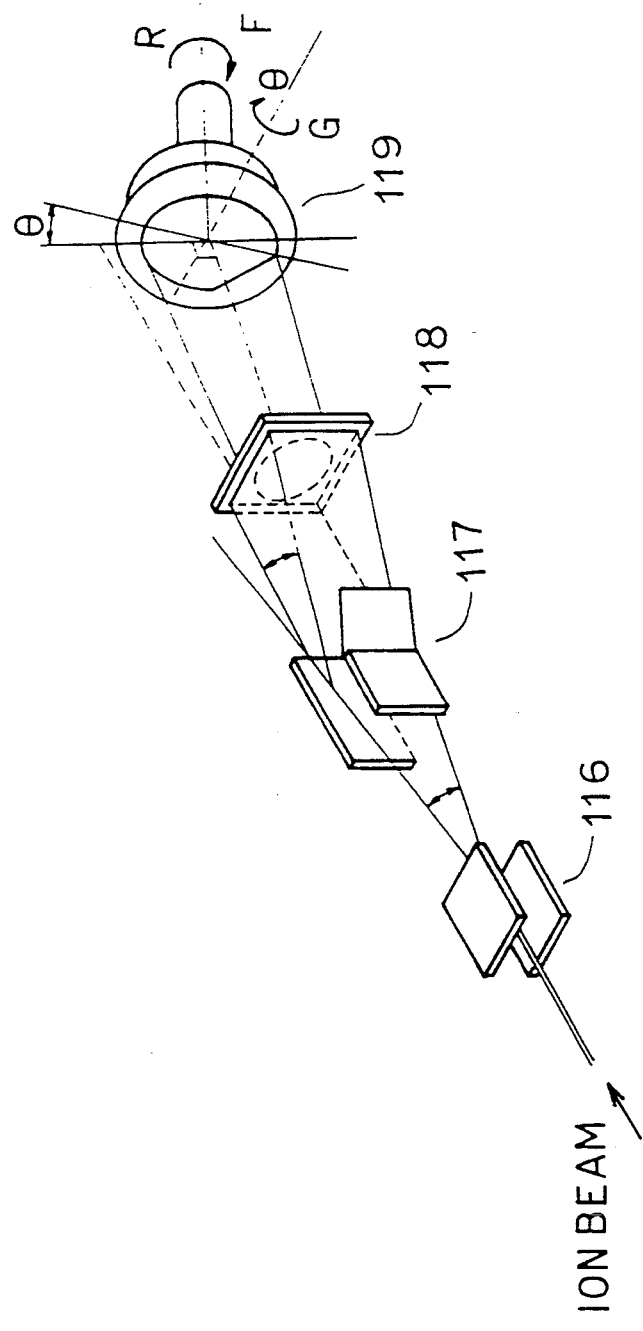
FIG. 12 is a schematic diagram of an apparatus of rotational implantation used in the present invention.

FIG. 12 is a schematic diagram of an apparatus of rotational implantation used in the present invention. The apparatus of rotational implantation includes a Y polarization plate 116, an X polarization plate 117, a mask 118, and a rotary target 119. Rotary target 119 can be tilted to the direction of an arrow G and an implantation angle $\theta$ of impurity ions are adjusted by this inclination angle. Rotary target 119 rotates in the direction of an arrow F, whereby the semiconductor substrate placed on rotary target 119 is rotated.

A method of implanting ions rotationally using the apparatus of rotational ion implantation will be described below. The silicon substrate shown in FIG. 2 is placed on rotary target 119. Then, rotary target 119 is tilted until an implantation angle 8 attains and is rotated in the direction of an arrow F. Next, an ion beam is emitted. The ion beam is extended vertically by Y polarization plate 116 and then horizontally by X polarization plate 117, and passes through mask 118 so as to be incident on the silicon substrate placed on rotary target 119. Thus, boron 8 is implanted rotationally at the inclination angle of 45° at the main surface of silicon substrate 1.

Figure 3:
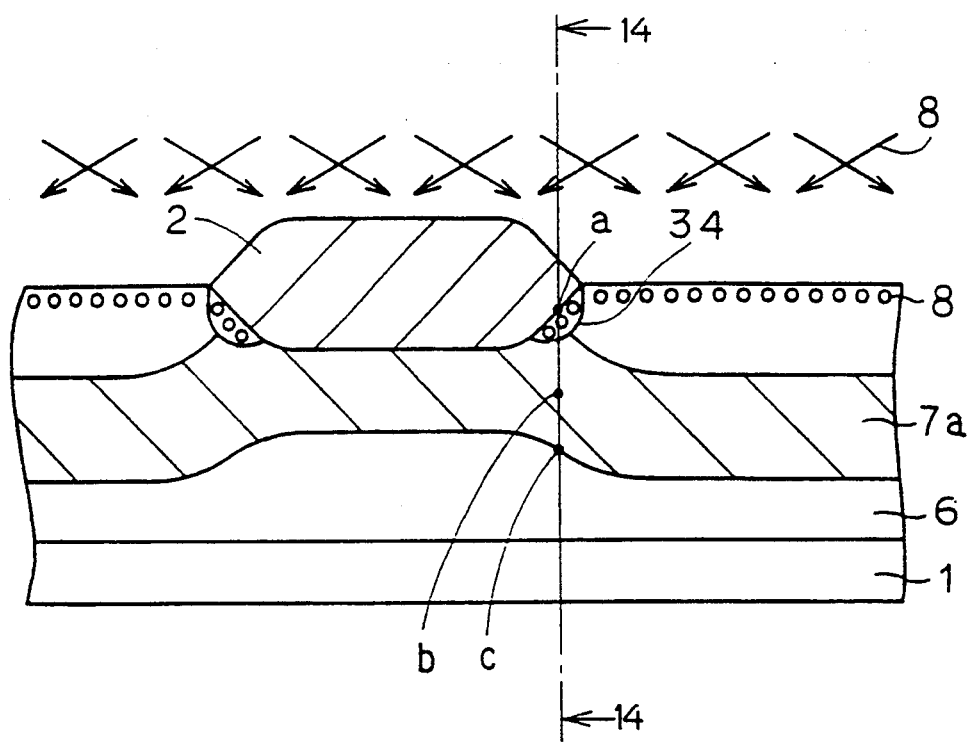
FIG. 3 is an enlarged sectional view of FIG. 2.
Figure 13:
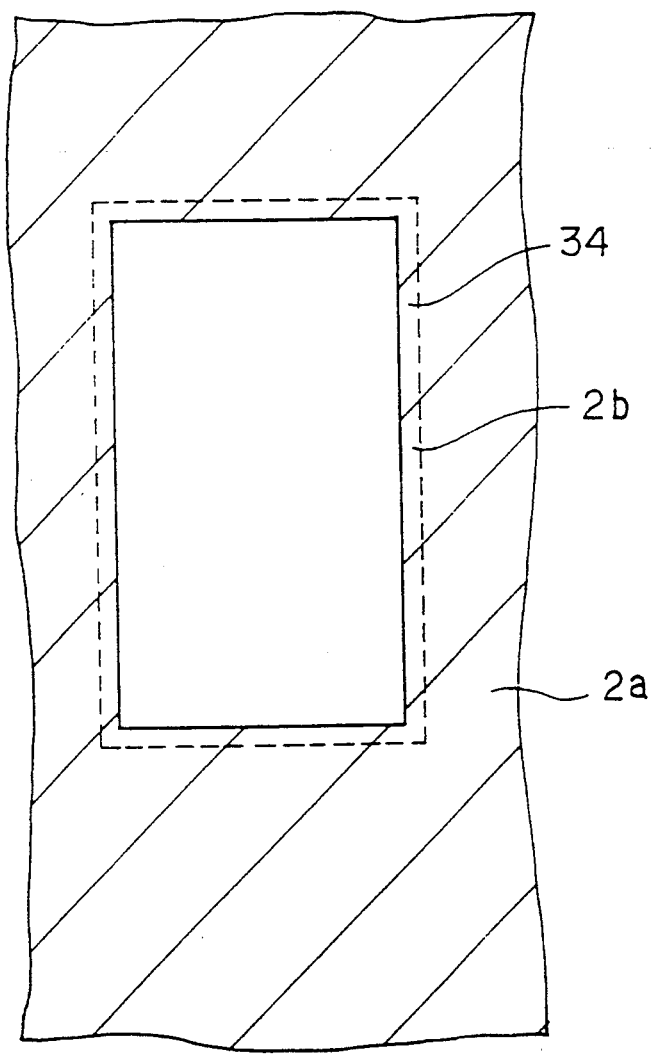
FIG. 13 is a plan view of an N-channel transistor region shown in FIG. 2.

FIG. 3 is an enlarged view of the element region. FIG. 13 is a plan view of the element region. Referring to FIGS. 2, 3, and 13, a P+ impurity region 34 (concentration: $1 \times 10^{17} - 5 \times 10^{17}$ atoms/cm$^3$) is formed directly under surrounding portion 2b of silicon oxide film 2 by implanting boron 8 rotationally at an inclination of 45°.

Figure 4:
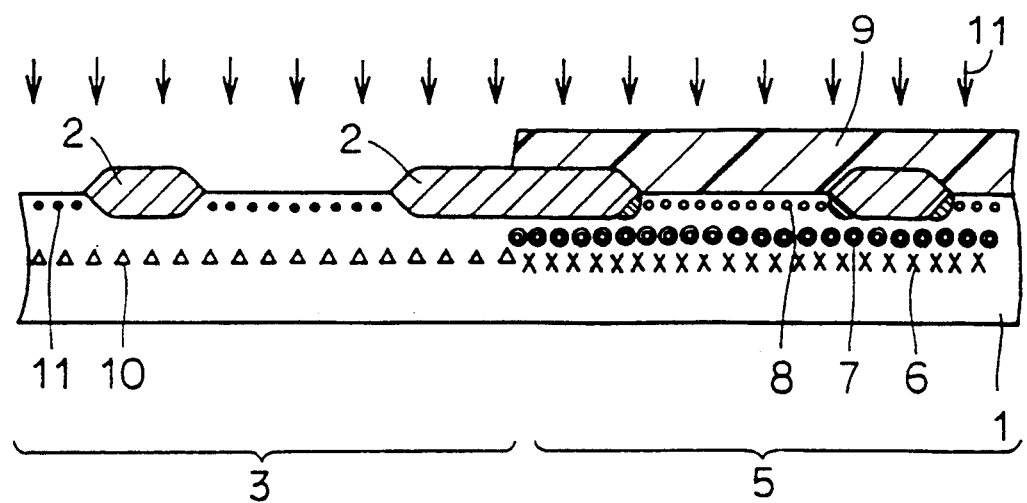
FIGS. 4–11 are cross sectional views of the semiconductor device in second to ninth steps of the first manufacturing method of the semiconductor substrate shown in FIG. 1.

Referring to FIG. 4, N-channel transistor region 5 is covered with a resist 9, and phosphorus 10 is implanted into P-channel transistor region 3 for forming a well under conditions of implantation energy: 1.2 MeV and implantation concentration: $1 \times 10^{12}$ atoms/cm$^2$. Boron 11 doped for a channel is implanted for determining threshold voltage Vth of the P-channel transistor under conditions of implantation energy: 20 KeV and implantation concentration: $1 \times 10^{12}$ atoms/cm$^2$.

Figure 5:
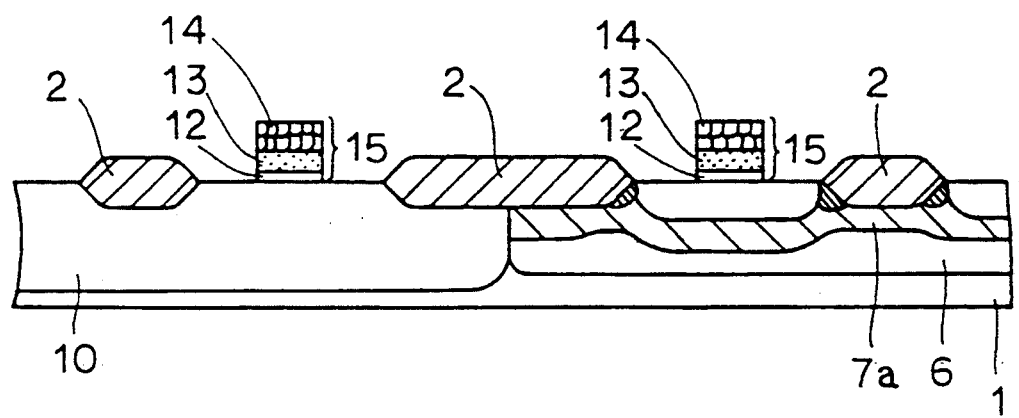

Referring to FIG. 5, a gate electrode 15 of a MOS transistor is formed by forming a silicon oxide film 12 having a film thickness of about 150Å, a phosphorus-doped polycrystalline silicon 13, and a tungsten silicide film 14 in turn.

Figure 6:
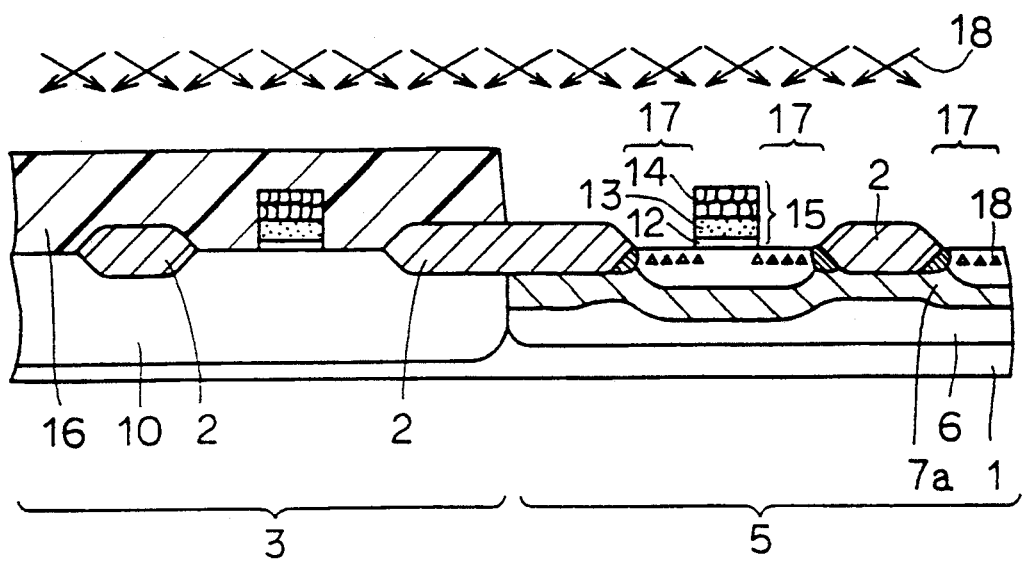

Referring to FIG. 6, P-channel transistor region 3 is covered with a resist 16, and phosphorus 18 is implanted rotationally into a source/drain region 17 of the N-channel transistor at an inclination angle of 45° under conditions of implantation energy: 50 KeV and implantation concentration: $2 \times 10^{13}$ atoms/cm$^2$. The oblique rotational implantation is for forming source/drain regions having a LDD structure.

Figure 7:
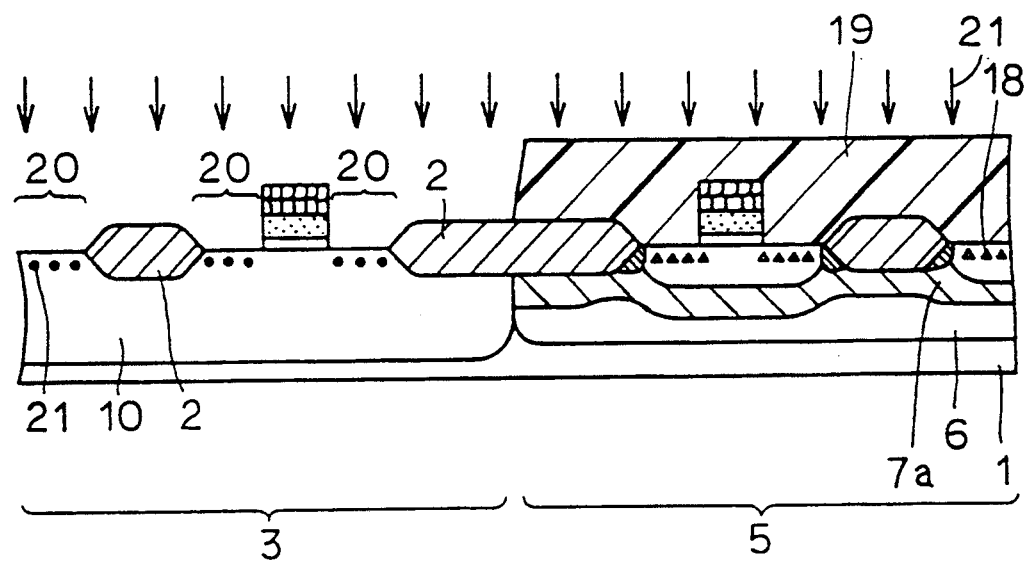

Referring to FIG. 7, N-channel transistor region 5 is covered with a resist 19, and boron difluoride 21 is implanted into a source/drain region 20 of the P-channel transistor under conditions of implantation energy: 20 KeV and implantation concentration: $1 \times 10^{13}$ atoms/cm$^2$.

Figure 8:
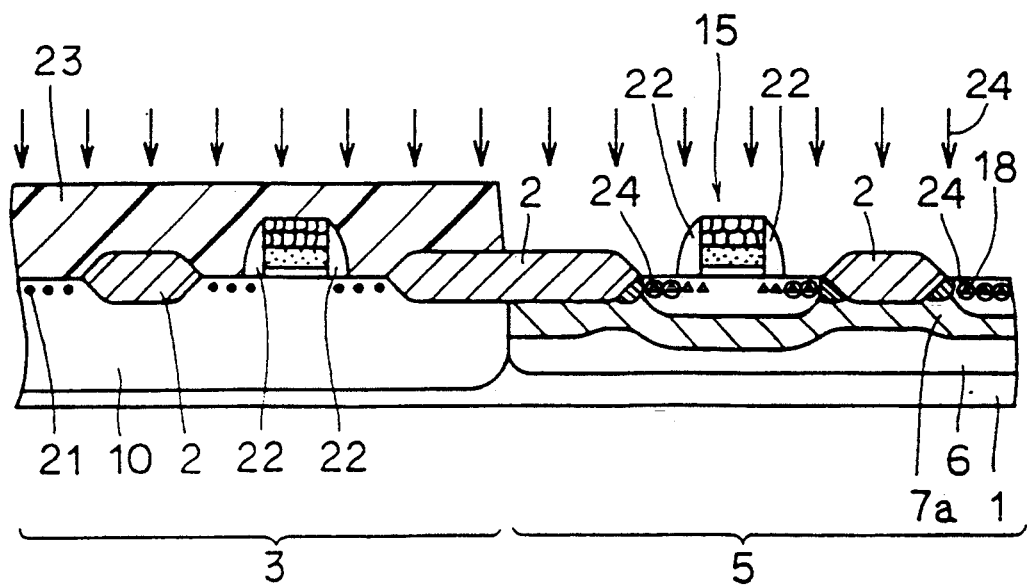

Referring to FIG. 8, a sidewall spacer 22 is formed by the silicon oxide film on the sidewall of gate electrode 15. Then, P-channel transistor region 3 is covered with a resist 23 and arsenic 24 is implanted into source/drain regions 17 of the N-channel transistor under conditions of implantation energy: 50 KeV and implantation concentration: $5 \times 10^{15}$ atoms/cm$^2$.

Figure 9:
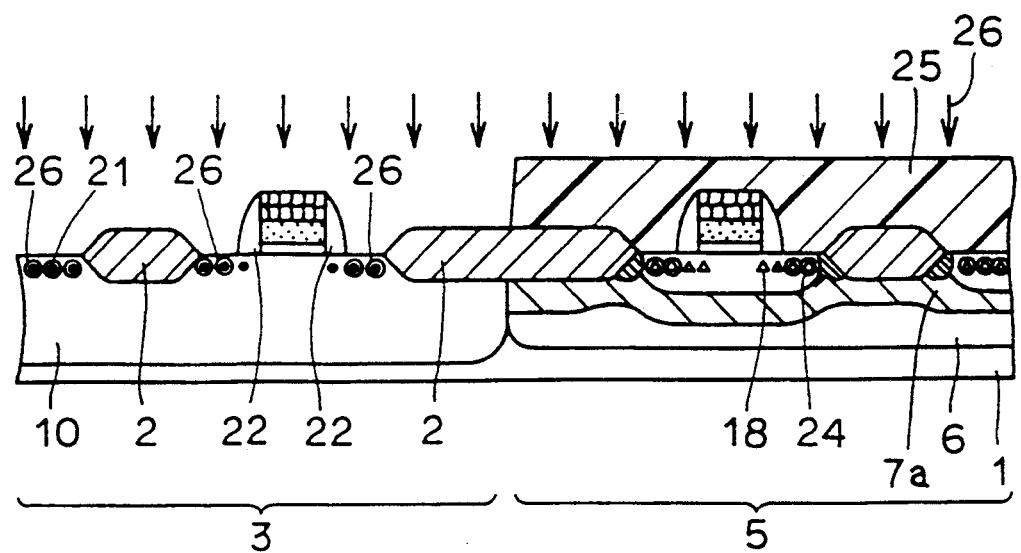

Referring to FIG. 9, N-channel transistor region 5 is covered with a resist 25 and boron difluoride 26 is implanted into source/drain regions 20 of the P-channel transistor under conditions of implantation energy: 20 KeV and implantation concentration: $5 \times 10^{15}$ atoms/cm$^2$.

Figure 10:
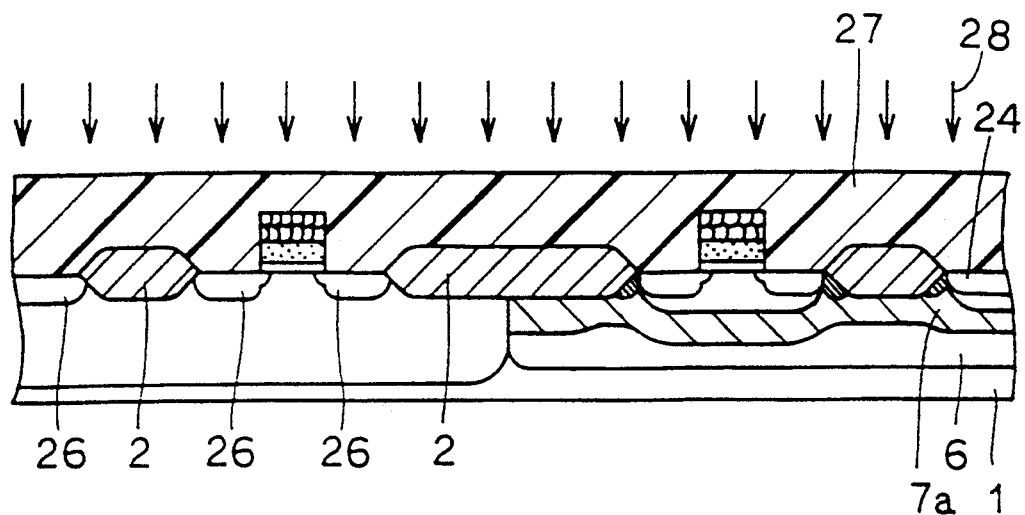

Referring to FIG. 10, heat treatment is conducted for about 10 minutes under oxygen atmosphere at 850° C. Then, portions other than ion-implantation-portion for ROM determination are covered with a resist 27, and boron 28 is implanted on a chip for ROM determination.

Figure 11:
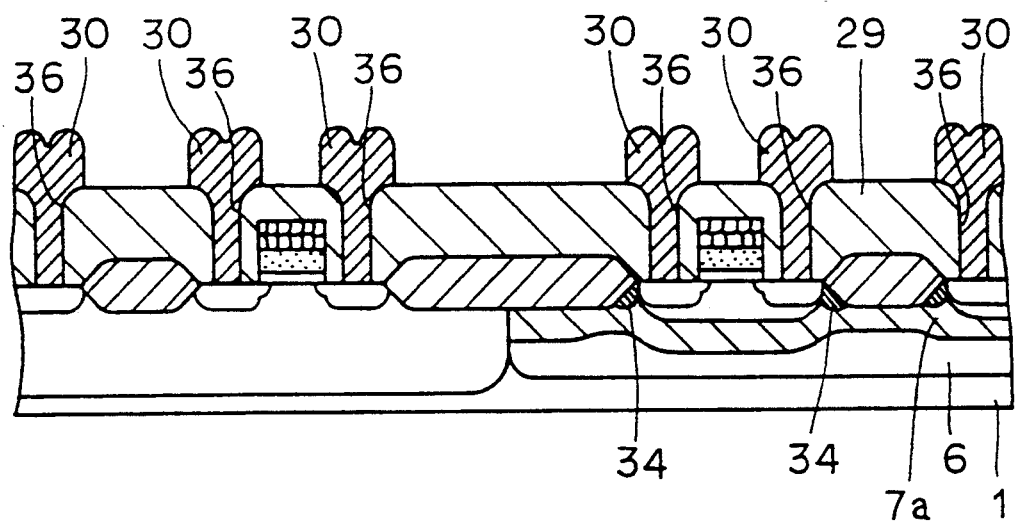
Figure 14:
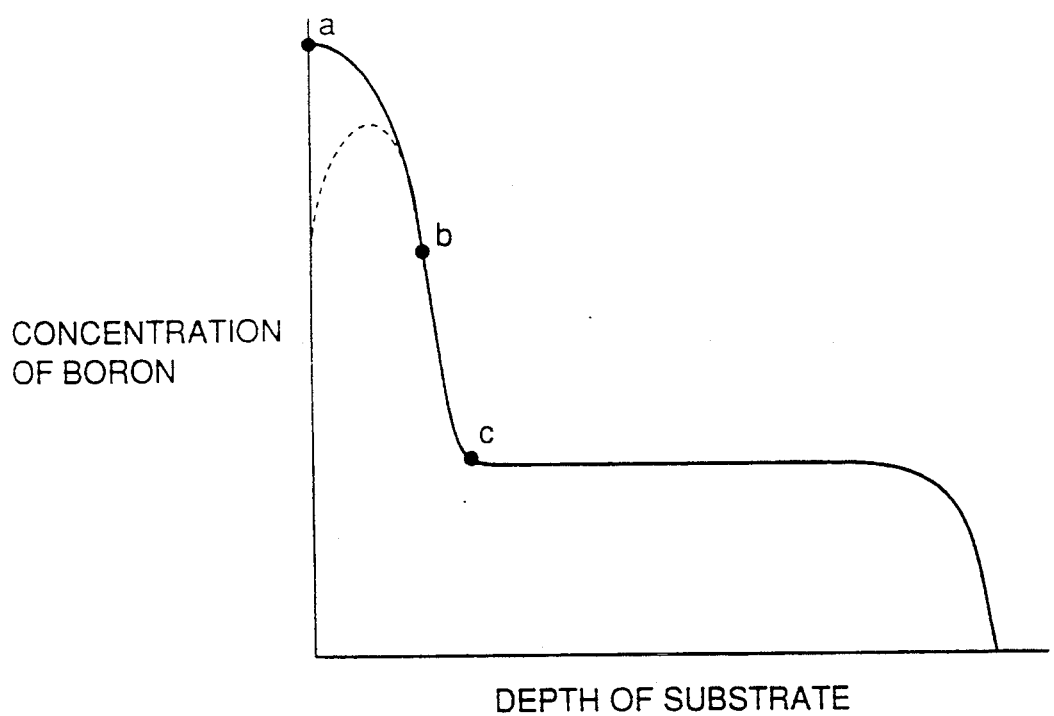
FIG. 14 is a profile of boron in the semiconductor substrate taken along line A—A of FIG. 3.

Referring to FIG. 11, an interlayer insulating film 29 is formed on silicon substrate 1 for covering the N-channel and the P-channel transistors. Contact holes 36 are formed in interlayer insulating film 29 for exposing source/drain regions of the N-channel and the P-channel transistors. An electrode 30 is connected to the source/drain regions through contact hole 36. Referring to FIG. 14 (a profile of boron in the semiconductor substrate taken along line A—A in FIG. 3), the isolation breakdown voltage increases in this embodiment, because the P-type impurity concentration is increased directly under the surrounding portion of the field oxide film. The concentration at point (b) in FIG. 14 is $1 \times 10^{16} - 5 \times 10^{16}$ atoms/cm$^3$, while the concentration at point (a) is $1 \times 10^{17} - 5 \times 10^{17}$ atoms/cm$^3$.

Figure 15:
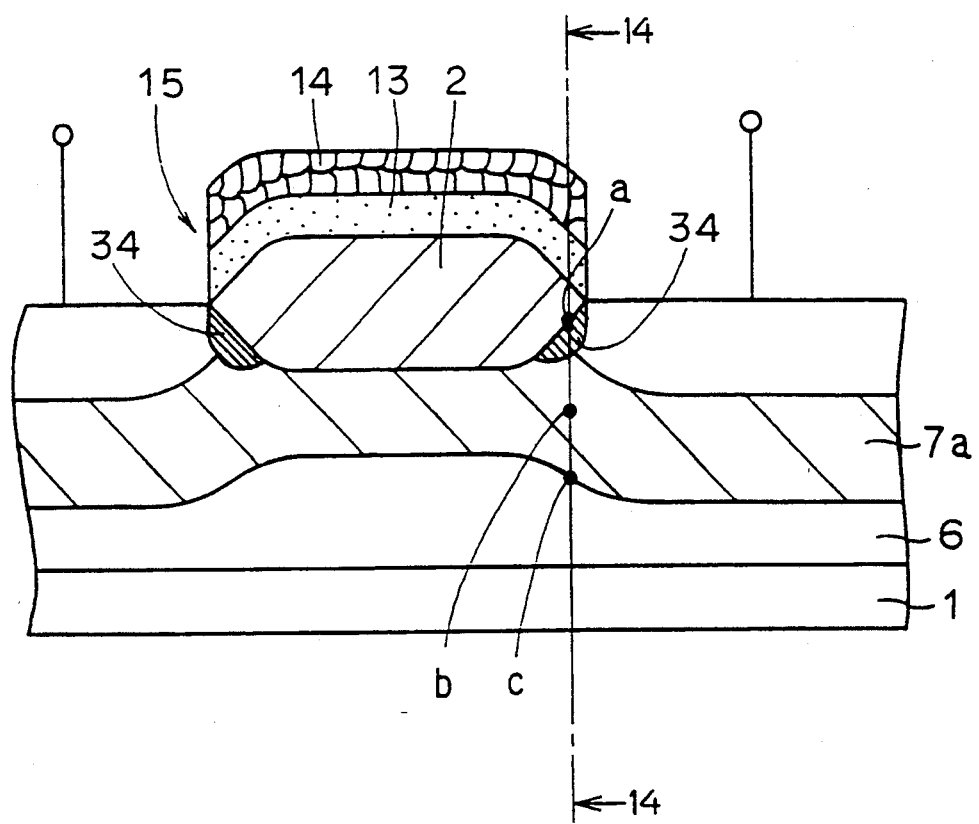
FIG. 15 is a sectional view of the N-channel field transistor formed simultaneously with the channel transistor shown in FIG. 1.
Figure 16:
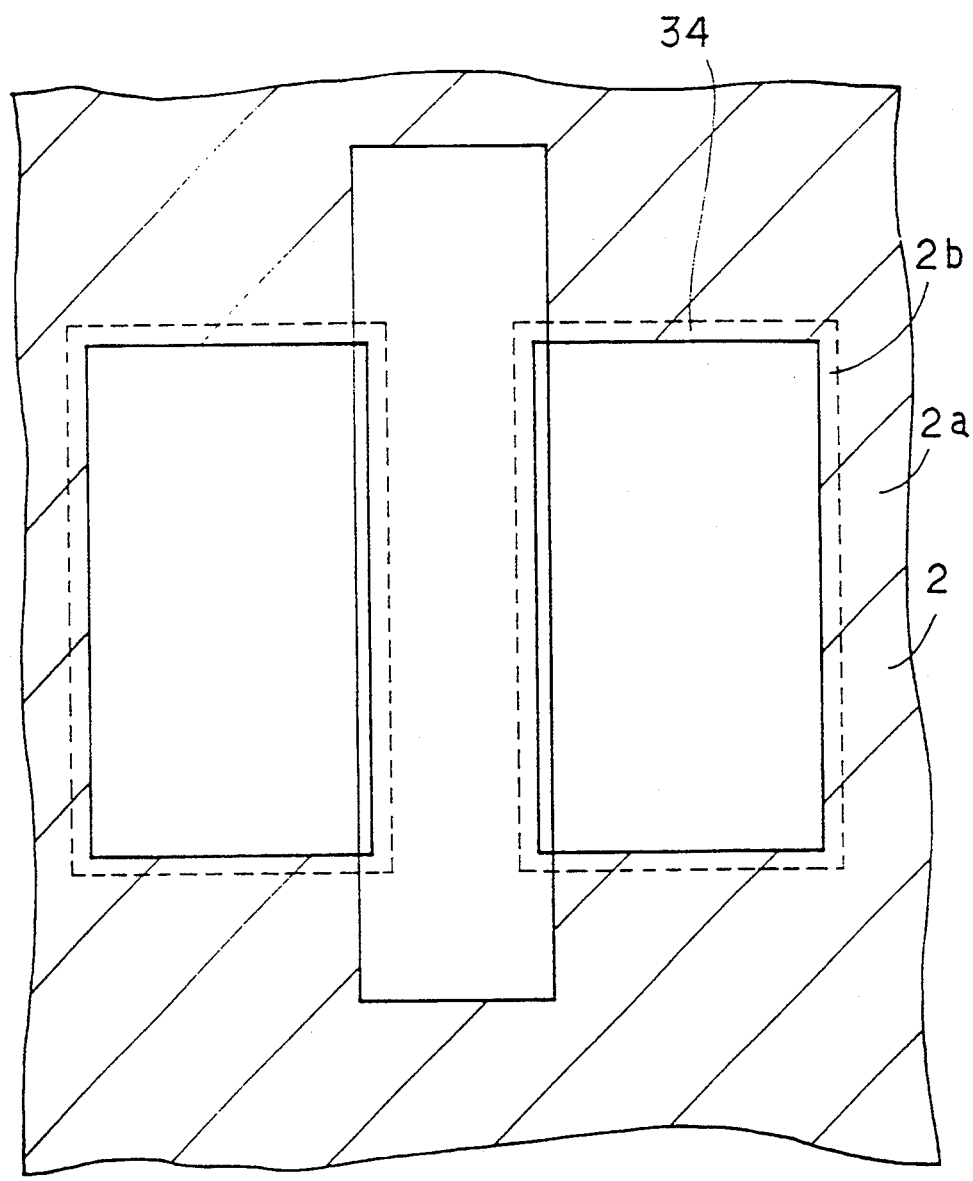
FIG. 16 is a plan view of the N-channel field transistor shown in FIG. 15.

FIG. 15 is a sectional view of the N-channel field transistor formed simultaneously with the semiconductor device shown in FIG. 1 for forming the input protection circuit. FIG. 16 is a plan view of the N-channel field transistor.

According to these drawings, the breakdown voltage of the N-channel field transistor increases because a P+ impurity region 34 having the P-type impurity concentration selected within the range of $1 \times 10^{17} - 5 \times 10^{17}$ atoms/cm$^3$ is formed directly under surrounding portion 2b of field oxide film 2. A profile of boron in the silicon substrate taken along line A—A in FIG. 15 is shown in FIG. 14.

EXAMPLE 2

FIGS. 17-27 are cross sectional views of the semiconductor device in respective steps of another manufacturing method of the semiconductor device shown in FIG. 1.

Figure 17:
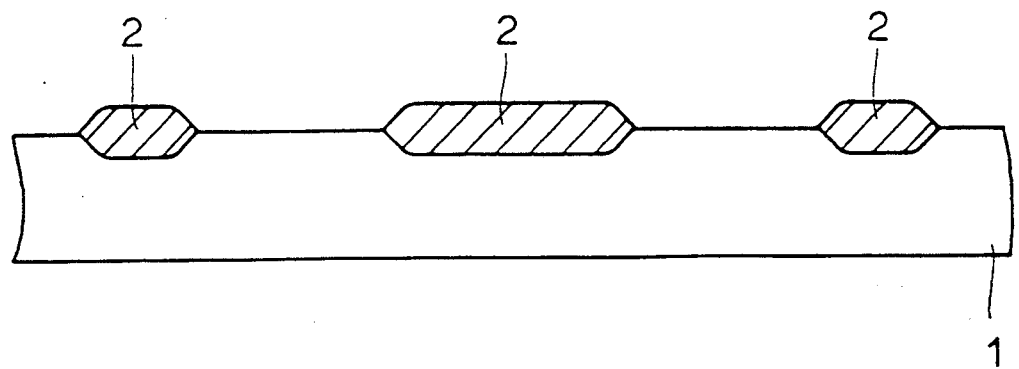
FIGS. 17–22 are cross sectional views of the semiconductor device in first to sixth steps of a second manufacturing method of the semiconductor device shown in FIG. 1.

Referring to FIG. 17, silicon oxide film 2 is formed for isolation through LOCOS method at the main surface of silicon substrate 1.

Figure 18:
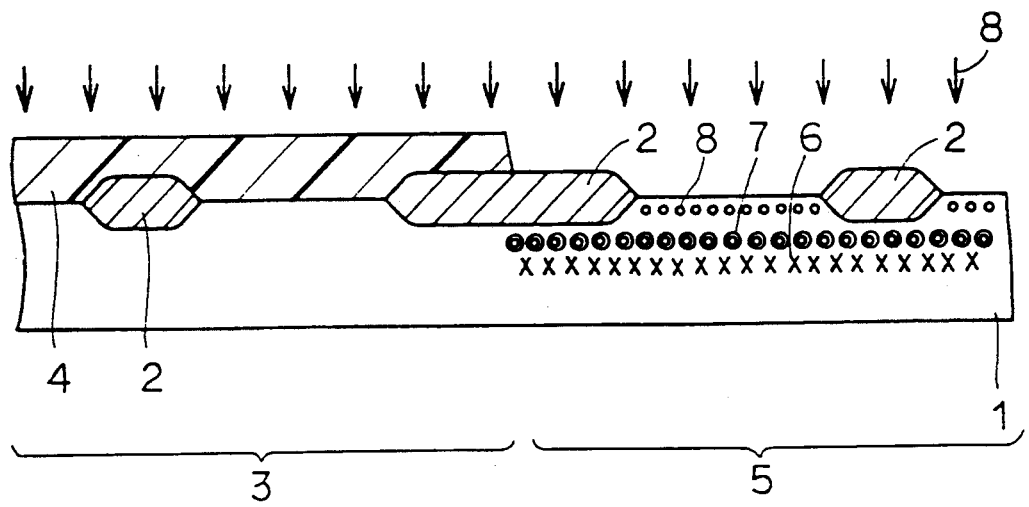

Referring to FIG. 18, P-channel transistor region 3 is covered with resist 4, and boron 6 is implanted into N-channel transistor region 5 for forming a well under conditions of implantation energy: 1 MeV and implantation concentration: $1 \times 10^{13}$ atoms/cm$^2$. Boron 7 is implanted for a channel cut of silicon oxide film 2 under conditions of implantation energy: 150 KeV and implantation concentration: $5 \times 10^{12}$ atoms/cm$^2$. Boron 8 doped for a channel is implanted for determining threshold voltage Vth of the N-channel transistor under conditions of implantation energy: 50 KeV and implantation concentration: $3 \times 10^{12}$ atoms/cm$^2$.

Figure 19:
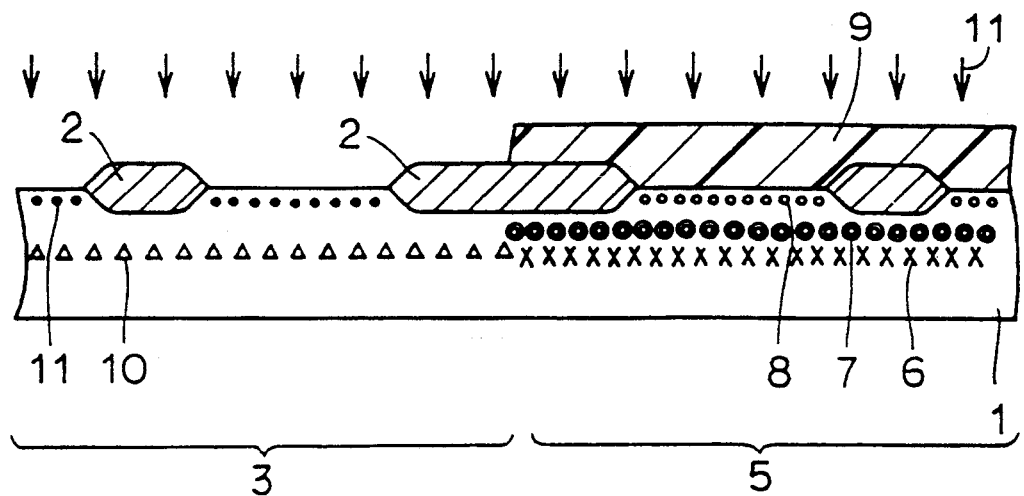

Referring to FIG. 19, N-channel transistor region 5 is covered with resist 9, and phosphorus 10 is implanted into P-channel transistor region 3 for forming a well under conditions of implantation energy: 1.2 MeV and implantation concentration: $1 \times 10^{13}$ atoms/cm$^2$. Boron 11 doped for a channel is implanted for determining threshold voltage Vth of the P-channel transistor under conditions of implantation energy: 20 KeV and implantation concentration: $1 \times 10^{12}$ atoms/cm$^2$.

Figure 20:
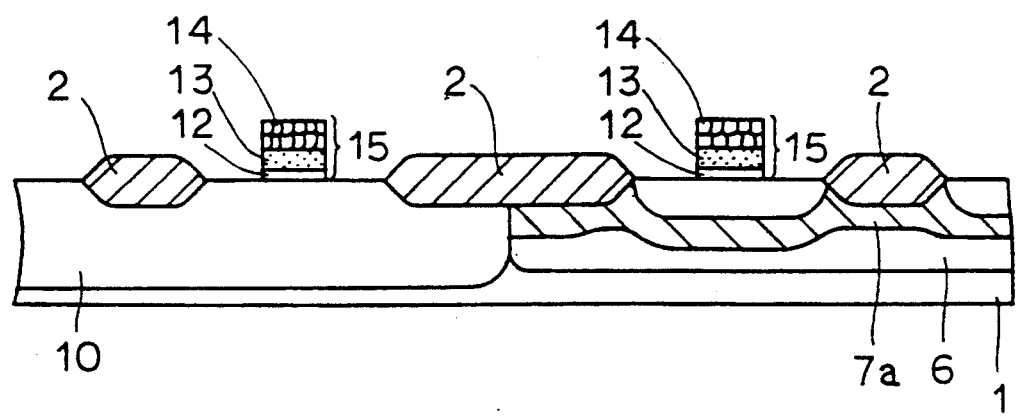

Referring to FIG. 20, gate electrode 15 of the MOS transistor is provided by forming silicon oxide film 12 having a thickness of about 150Å, phosphorus-doped polycrystalline silicon film 13, and tungsten silicide film 14 in turn.

Figure 21:
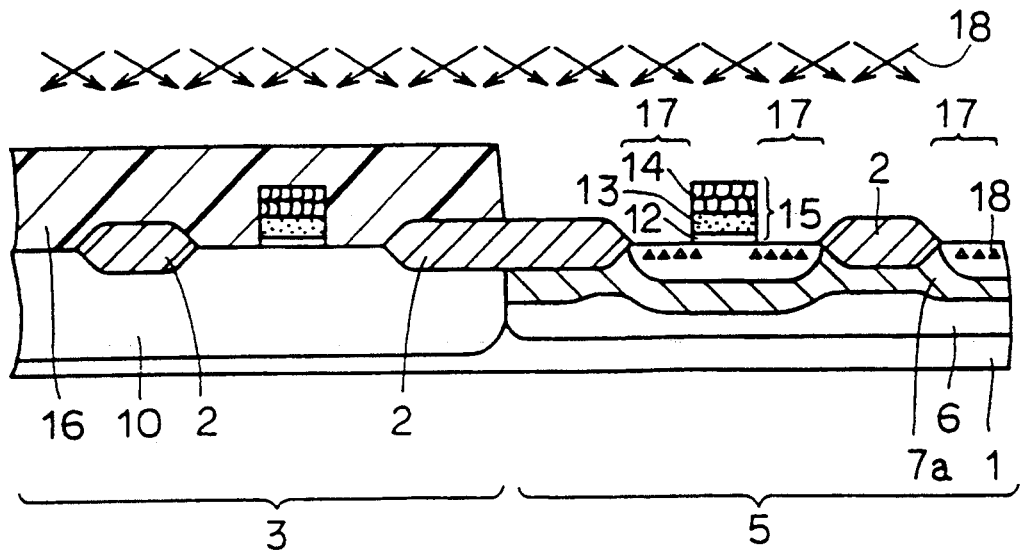

Referring to FIG. 21, P-channel transistor region 3 is covered with resist 16, and phosphorus 18 is implanted rotationally at an inclination angle of 45° into source/drain region 17 of the N-channel transistor under conditions of implantation energy: 50 KeV and implantation concentration: $2 \times 10^{13}$ atoms/cm$^2$ for constructing a transistor of a LDD structure.

Figure 22:
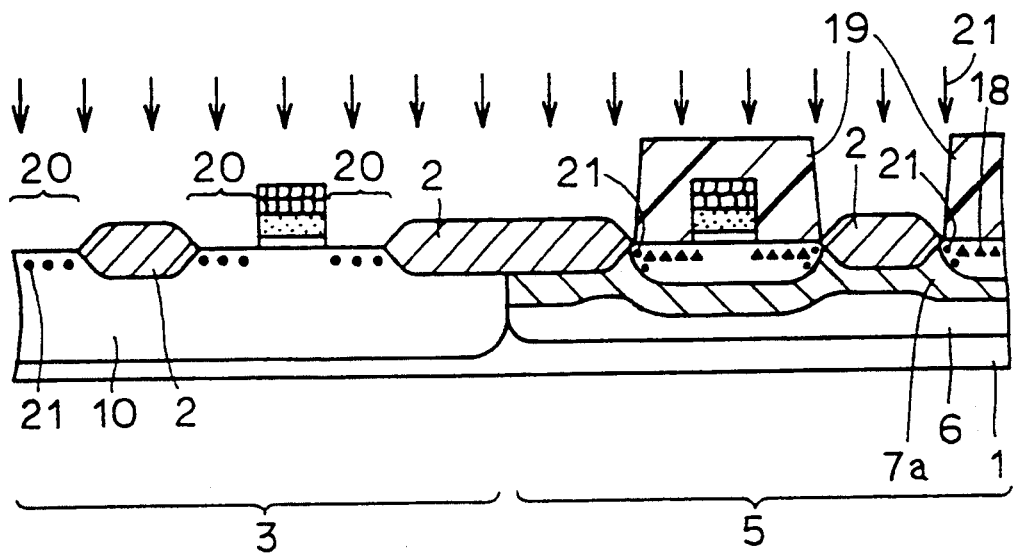
Figure 23:
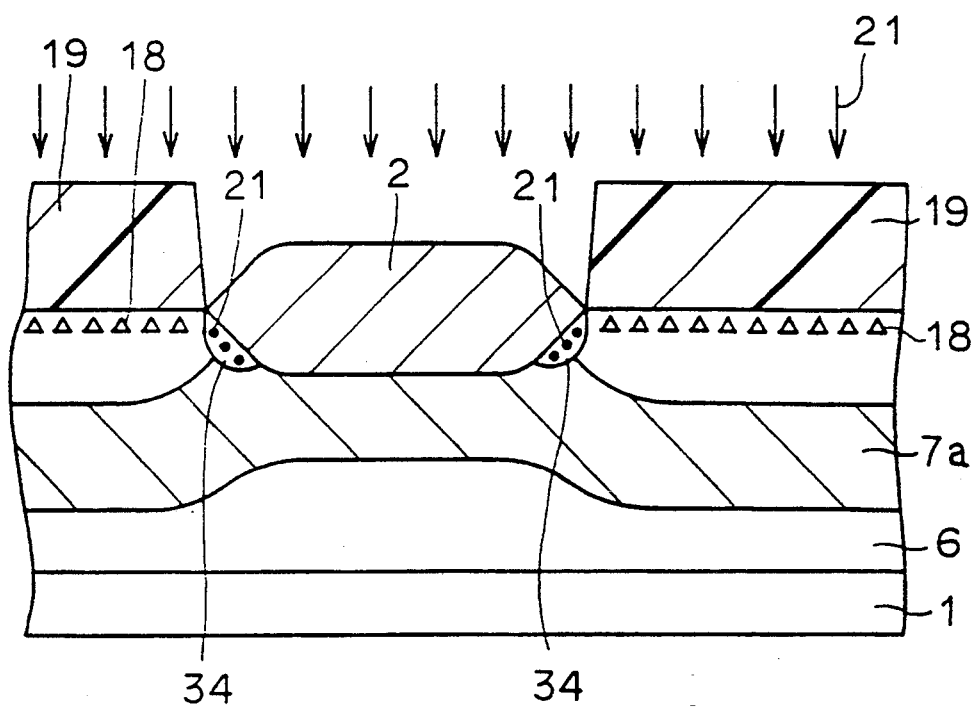
FIG. 23 is an enlarged sectional view of FIG. 22.

Referring to FIG. 22, N-channel transistor region 5 is covered with resist 19 so that the upper portion of surrounding portion 2b of field oxide film 2 is not covered with the resist. FIG. 23 shows an enlarged sectional view of field oxide film 2.

Referring to FIGS. 22 and 23, boron difluoride 21 is implanted into source/drain regions 20 of the P-channel transistor using resist 19 as a mask under condition of implantation energy: 20 KeV, and concentration: $1 \times 10^{13}$ atoms/cm$^2$ (so as to obtain the concentration of $5 \times 10^{16}$–$1 \times 10^{17}$ atoms/cm$^3$ in the substrate). Since surrounding portion 2b of field oxide film 2 is not covered with the resist, P+ impurity region 34 having a concentration of $1 \times 10^{17}$–$5 \times 10^{17}$ atoms/cm$^3$ is formed directly under surrounding portion 2b of field oxide film 2.

Figure 24:
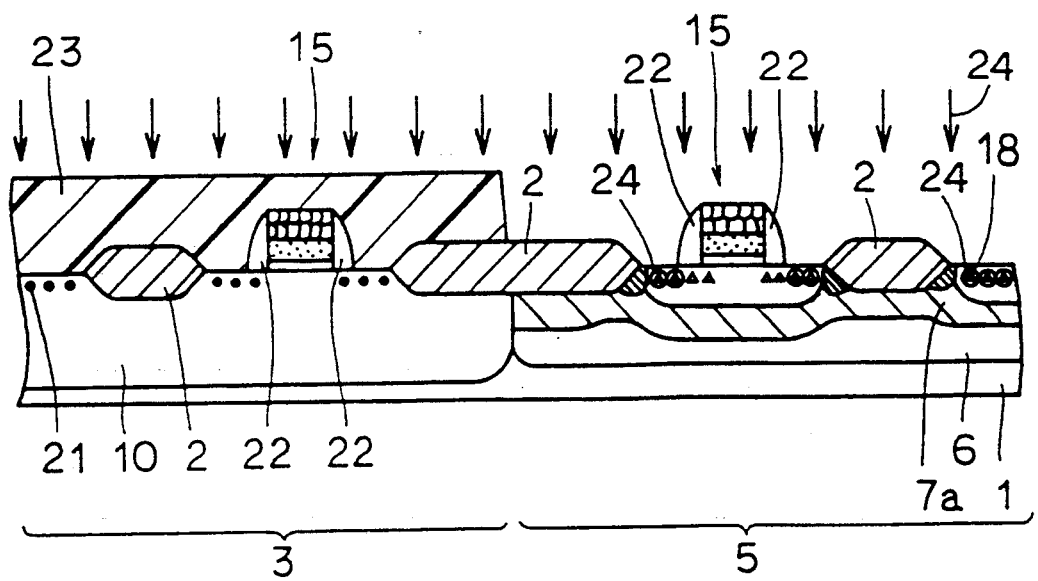
FIGS. 24–27 are cross sectional views of the semiconductor device in seventh to tenth steps of the second manufacturing method of the semiconductor device shown in FIG. 1.

Referring to FIG. 24, a sidewall spacer 22 is formed on the sidewall of gate electrode 15. Then, P-channel transistor region 3 is covered with a resist 23, and arsenic 24 is implanted into the source/drain region of the N-channel transistor under conditions of implantation energy: 50 KeV and implantation concentration: $5 \times 10^{15}$ atoms/cm$^2$.

Figure 25:
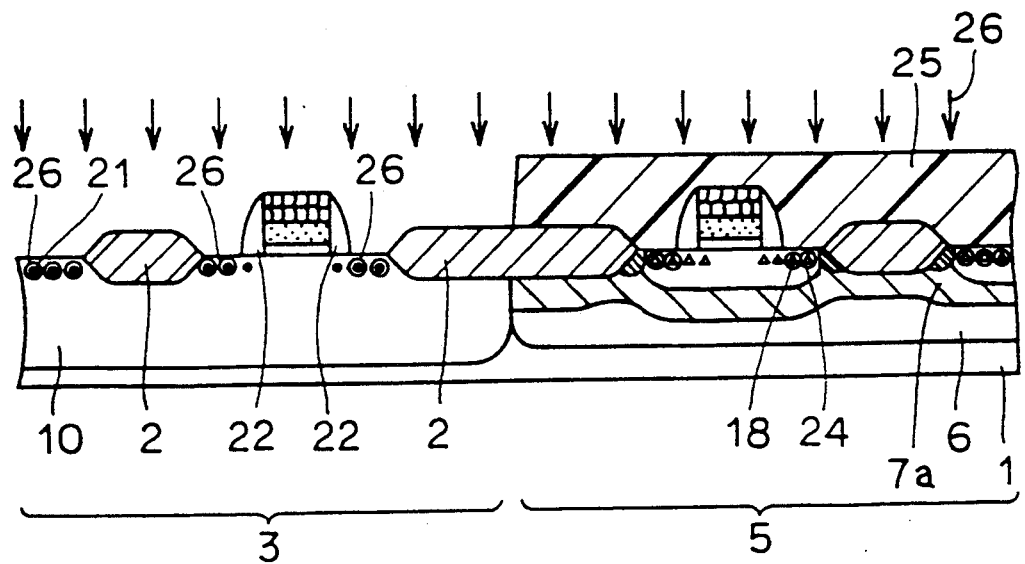

Referring to FIG. 25, N-channel transistor region 5 is covered with resist 25, and boron difluoride 26 is implanted into the source/drain region of the P-channel transistor under conditions of implantation energy: 20 KeV and implantation concentration: $5 \times 10^{15}$ atoms/cm$^2$.

Figure 26:
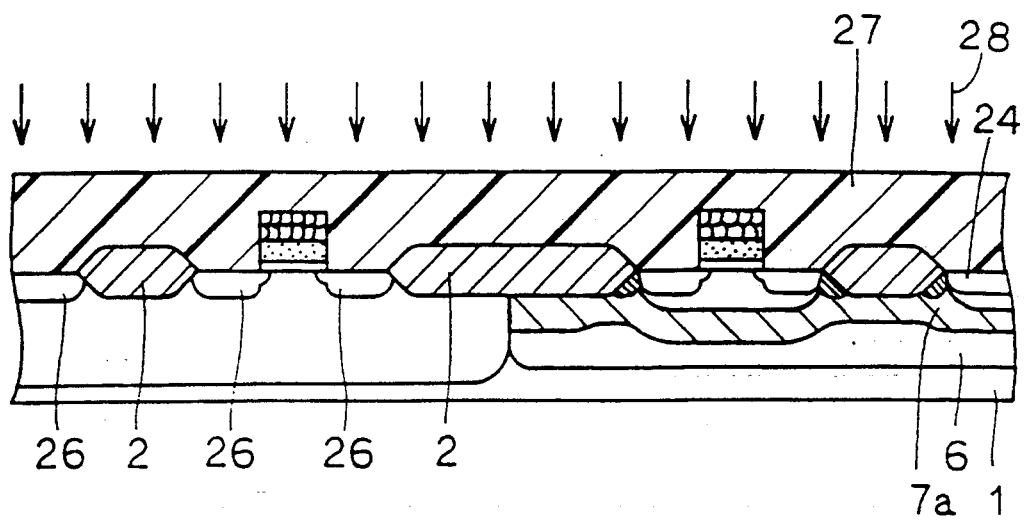

Referring to FIG. 26, heat treatment is conducted for about 20 minutes under oxygen atmosphere at 850° C. Then, portions other than ion-implantation-portion for ROM determination are covered with resist 27, and boron 28 is implanted on the chip for ROM determination. Resist 27 is them removed.

Figure 27:
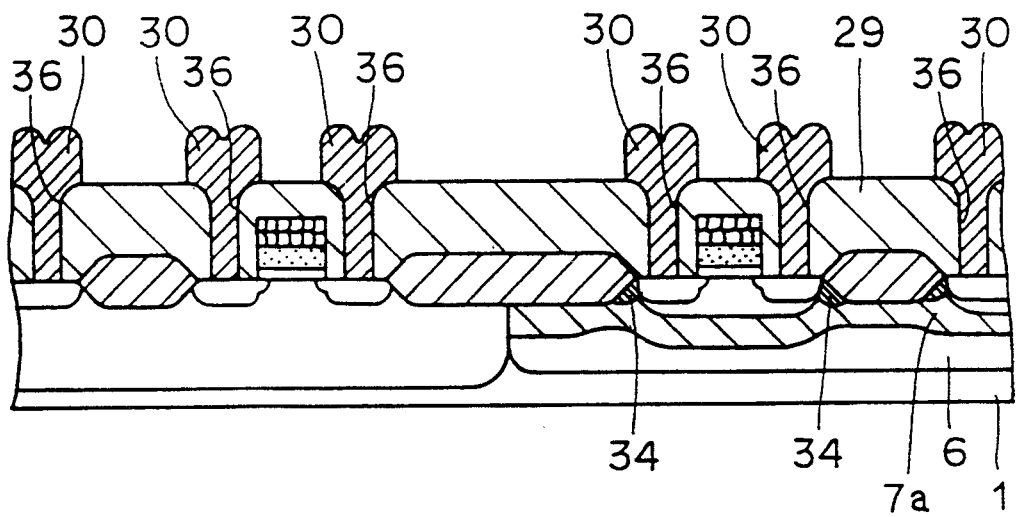
Figure 28:
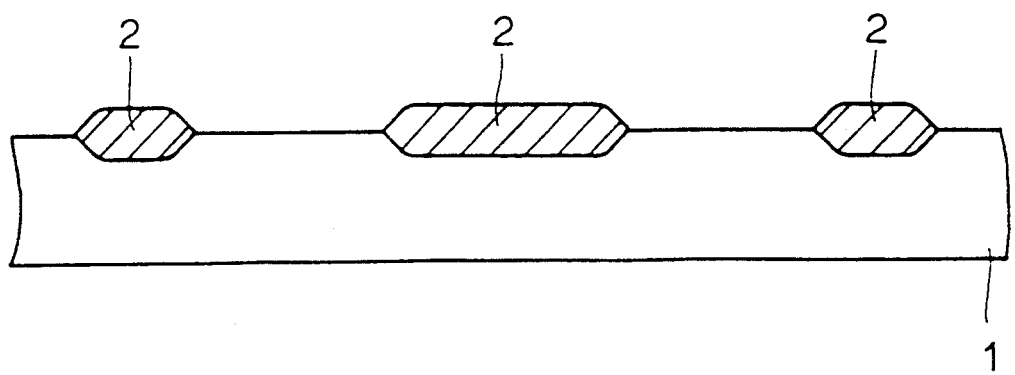
FIGS. 28–36 are cross sectional views of the semiconductor device in first to ninth steps of a third manufacturing method of the semiconductor device shown in FIG. 1.
Figure 29:
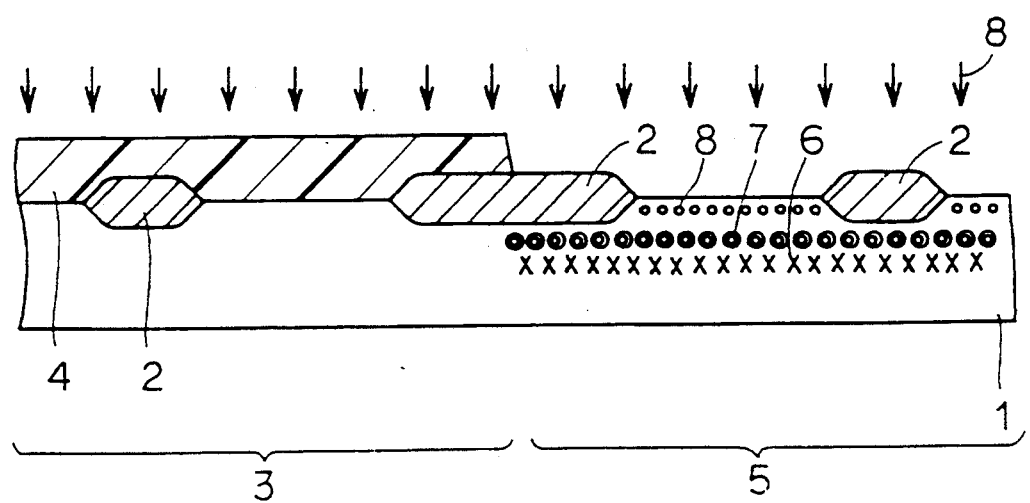
Figure 30:
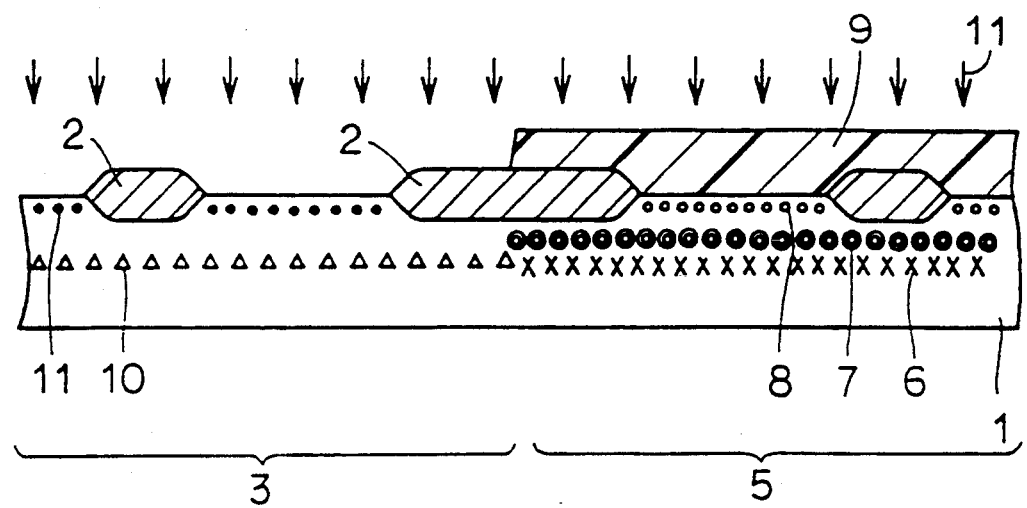
Figure 31:
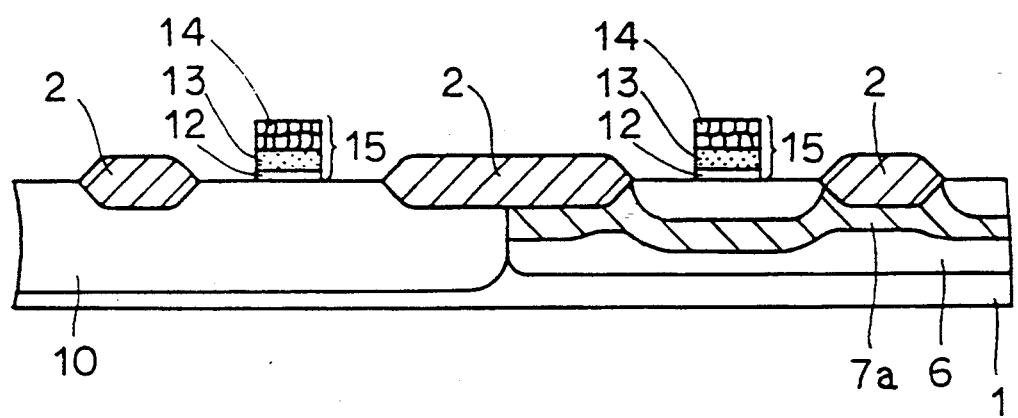
Figure 32:
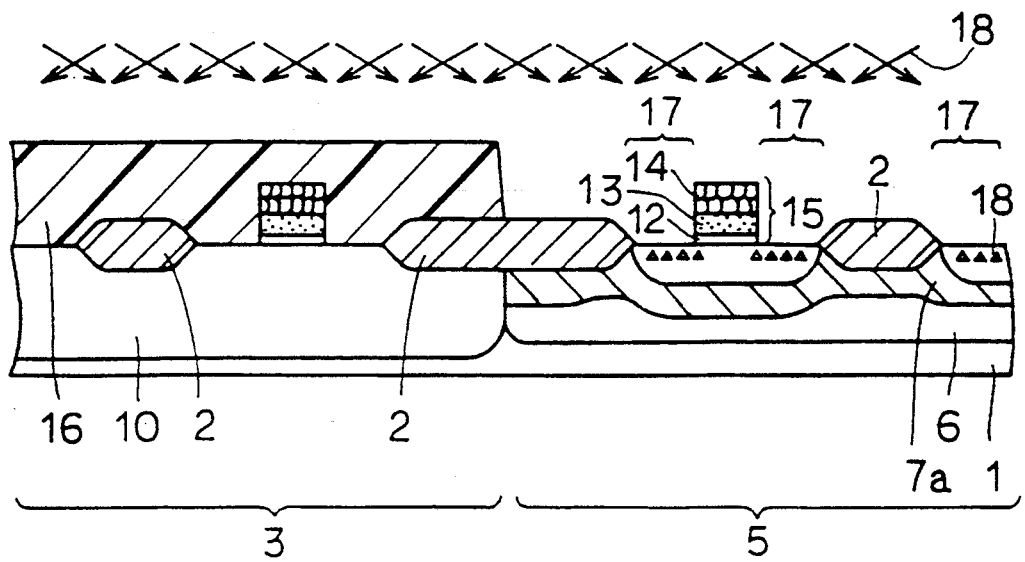
Figure 33:
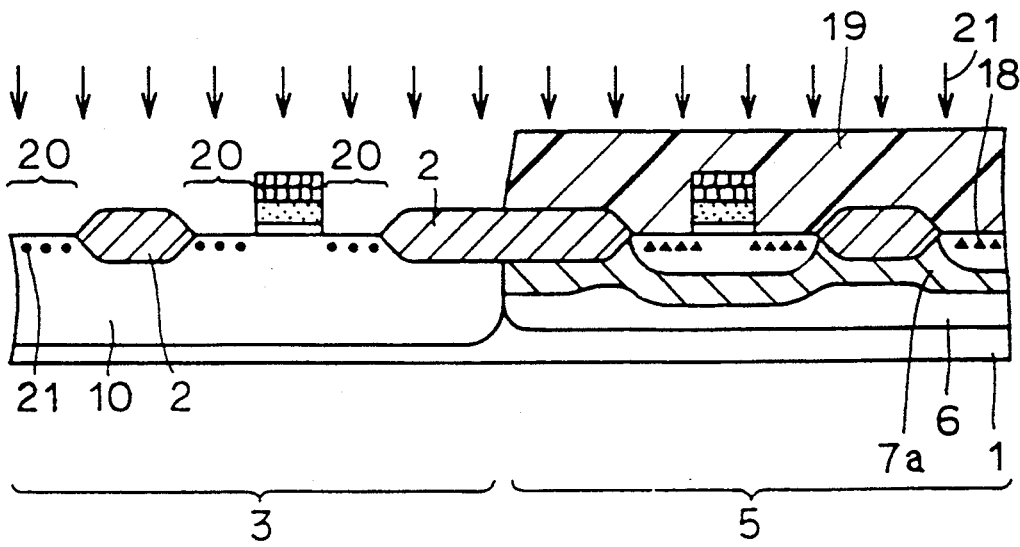
Figure 34:
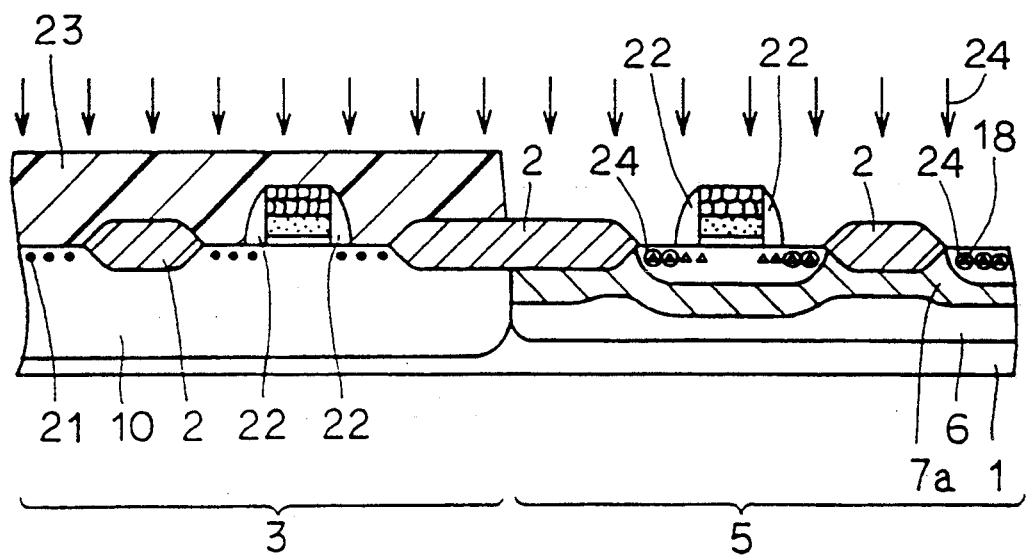
Figure 35:
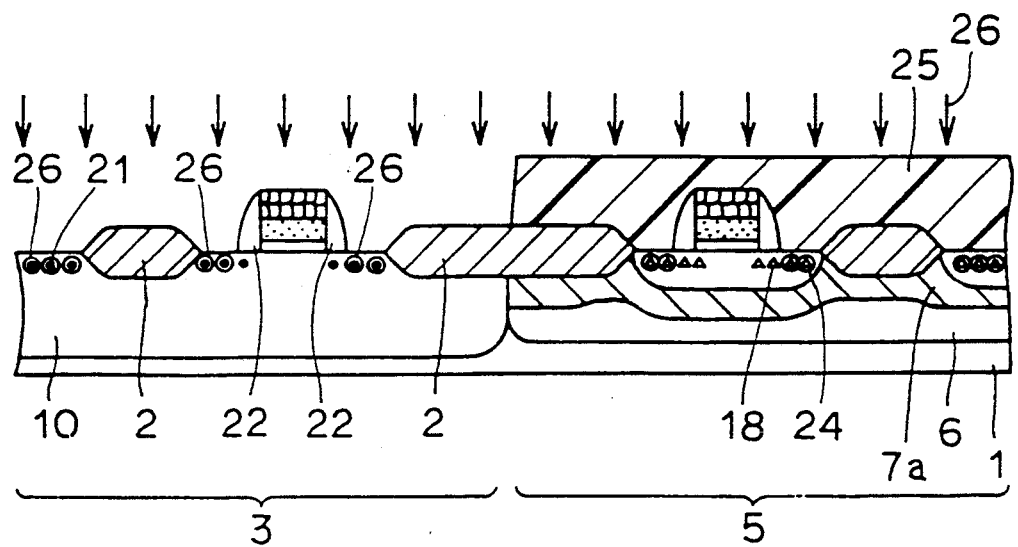

Referring to FIG. 27, interlayer insulating film 29 is formed on silicon substrate 1 for covering the N-channel and the P-channel transistors. Contact holes 36 are formed in interlayer insulating film 29 for exposing the surfaces of the source/drain regions of the N-channel and the P-channel transistors. Electrodes 30 are connected to the source/drain regions through contact holes 36.

EXAMPLE 3

FIGS. 28–38 are cross sectional views of the semiconductor device in respective steps of still another manufacturing process of the semiconductor device shown in FIG. 1.

FIGS. 28–35 are similar to the conventional steps shown in FIGS. 41–48, and like reference numerals are given to the corresponding parts, so that the description thereof will not be given again.

Figure 36:
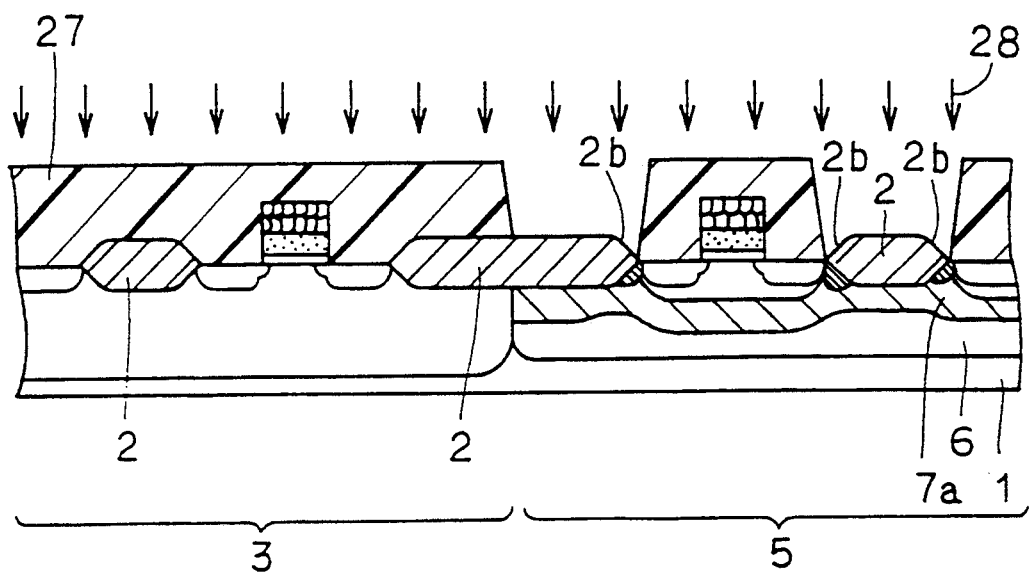
Figure 37:
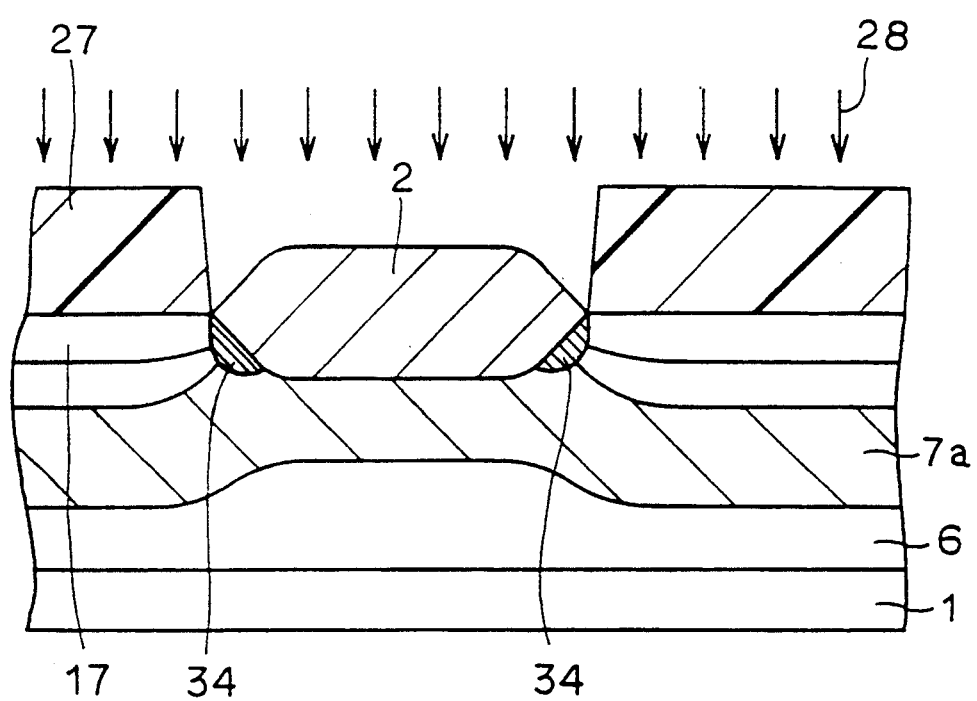
FIG. 37 is an enlarged sectional view of FIG. 36.

Referring to FIG. 36, portions other than ion-implantation-portion for ROM determination are covered with resist 27 so that the upper portion of surrounding portion 2b of silicon oxide film 2 in N-channel transistor region 5 is not covered with resist 27. FIG. 37 is an enlarged sectional view of silicon oxide film 2 in N-channel transistor region 5.

Referring to FIGS. 36 and 37, boron 28 is implanted using resist 27 as a mask. Since surrounding portion 2b of field oxide film 2 is not covered with resist 27, P+ impurity region 34 having a concentration of about $1 \times 10^{17}$–$5 \times 10^{17}$ atoms/cm$^2$ is formed directly under surrounding portion 2b of field oxide film 2. Resist 27 is then removed.

Figure 38:
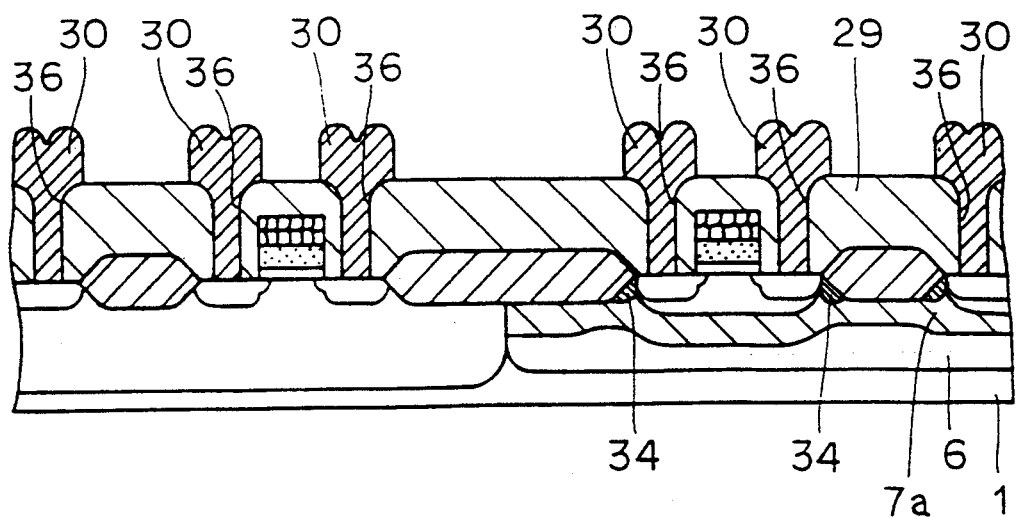
FIG. 38 is a cross sectional view of the semiconductor device in a tenth step of the third manufacturing step of the semiconductor device shown in FIG. 1.

Referring to FIG. 38, interlayer insulating film 29 is formed on silicon substrate 1 for covering the N-channel and the P-channel transistors. Contact holes 36 are formed in interlayer insulating film 29 for exposing the surfaces of the source/drain regions of the N-channel and the P-channel transistors. Electrodes 30 are connected to the source/drain regions through contact holes 36.

In the above-described manufacturing process, the number of mask alignment does not increase because P+ impurity region 34 is formed utilizing the step of doping a channel, the step of forming P-source/drain region, or the step of implanting ROM. Thus, the P+ impurity region can be formed without increasing the number of steps required.

EXAMPLE 4

Figure 39:
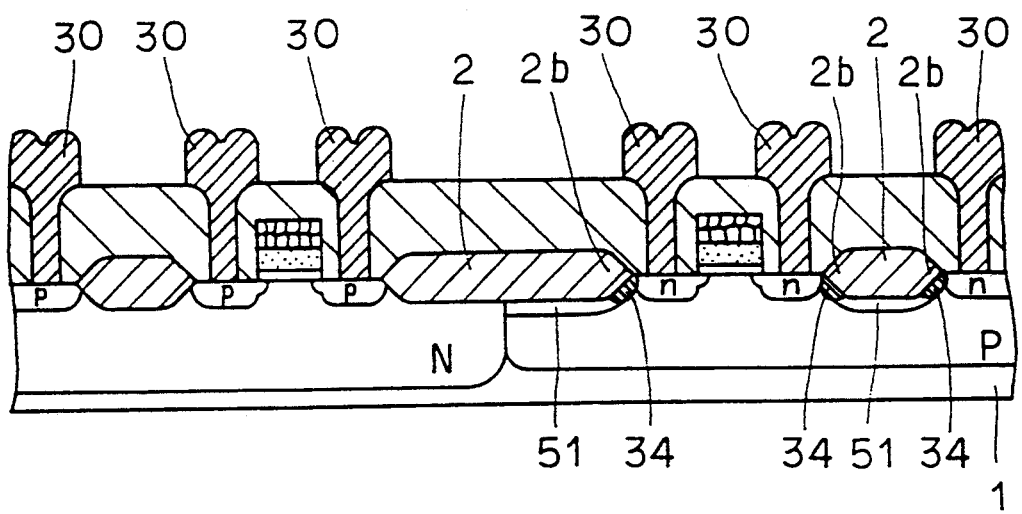
FIG. 39 is a sectional view of a semiconductor device according to still another embodiment of the present invention.
Figure 40:
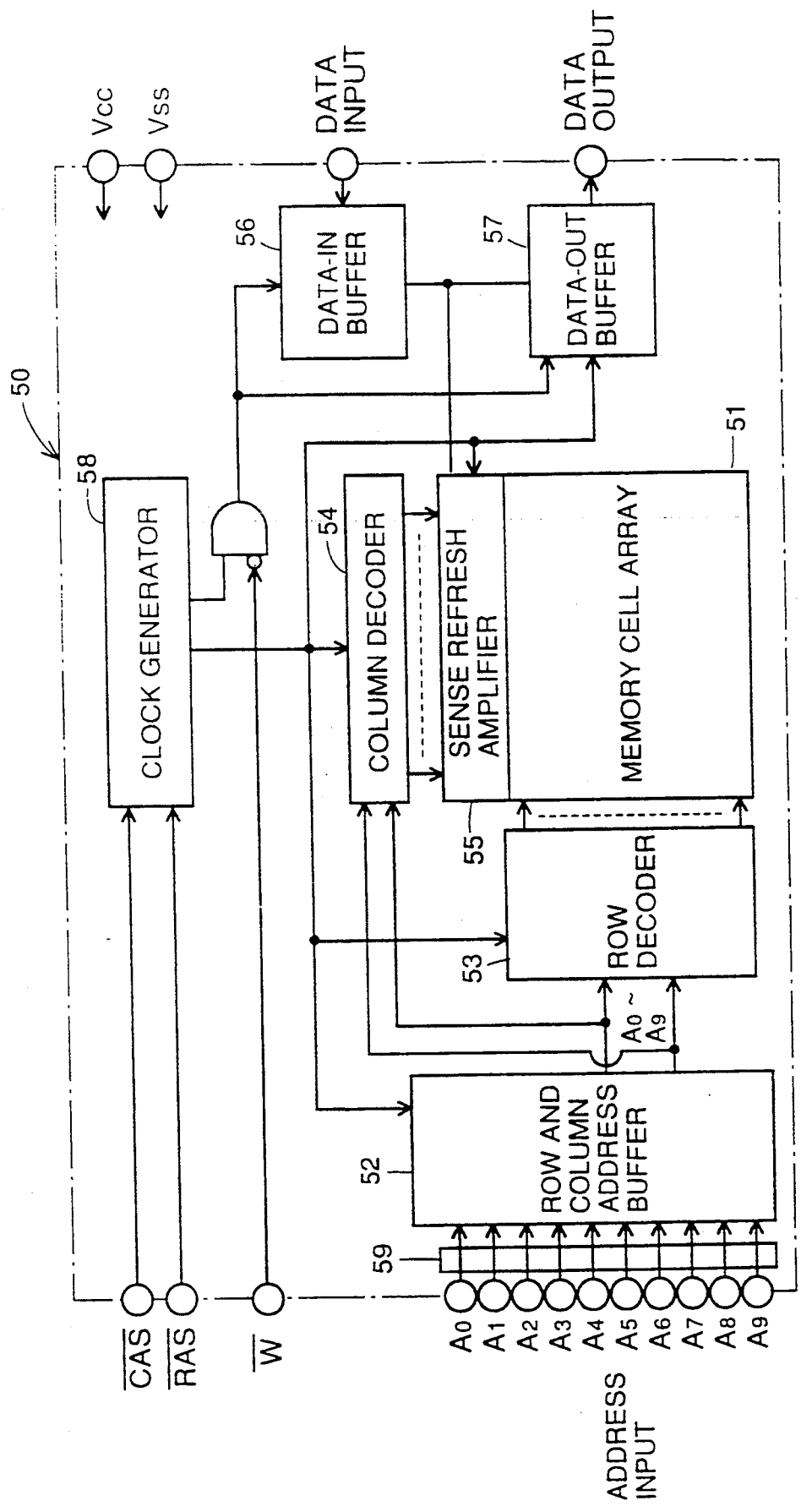
FIG. 40 is a block diagram of a conventional DRAM.
Figure 41:
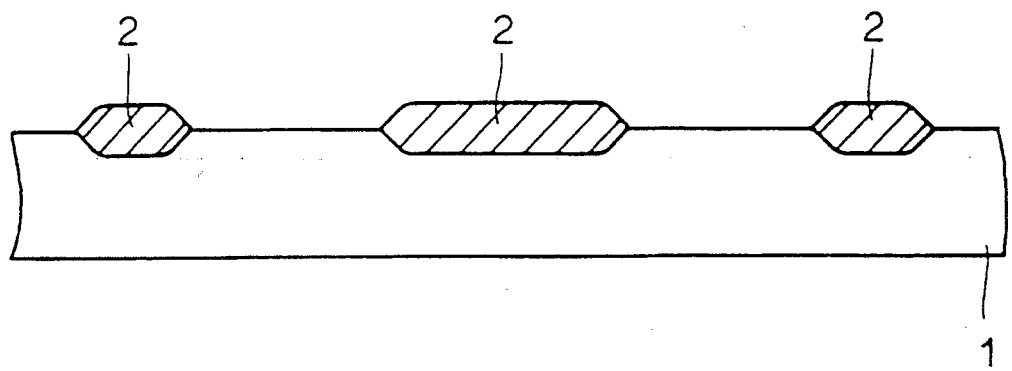
FIGS. 41–48, 49A, 49B, 50A, 50B, 51 are cross sectional views of the semiconductor device in first to tenth steps of a manufacturing method of the conventional semiconductor device.
Figure 42:
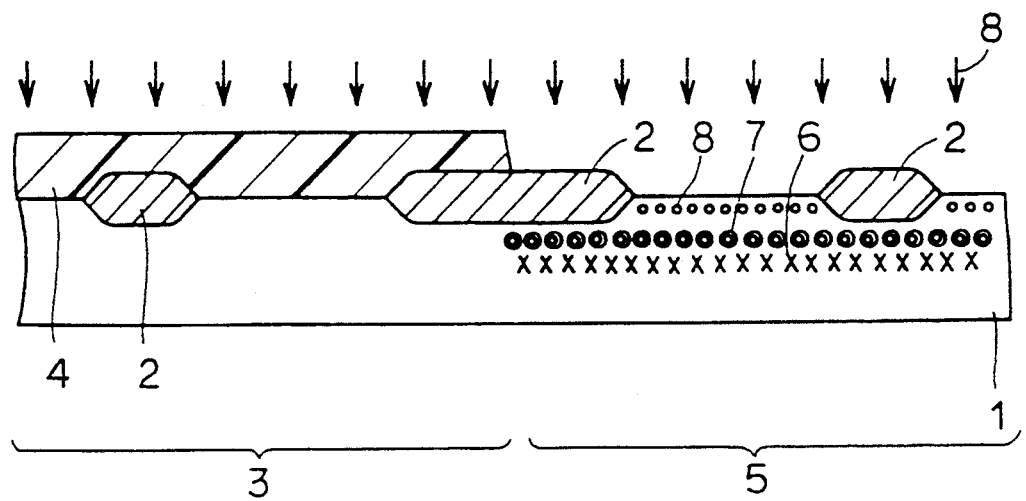
Figure 43:
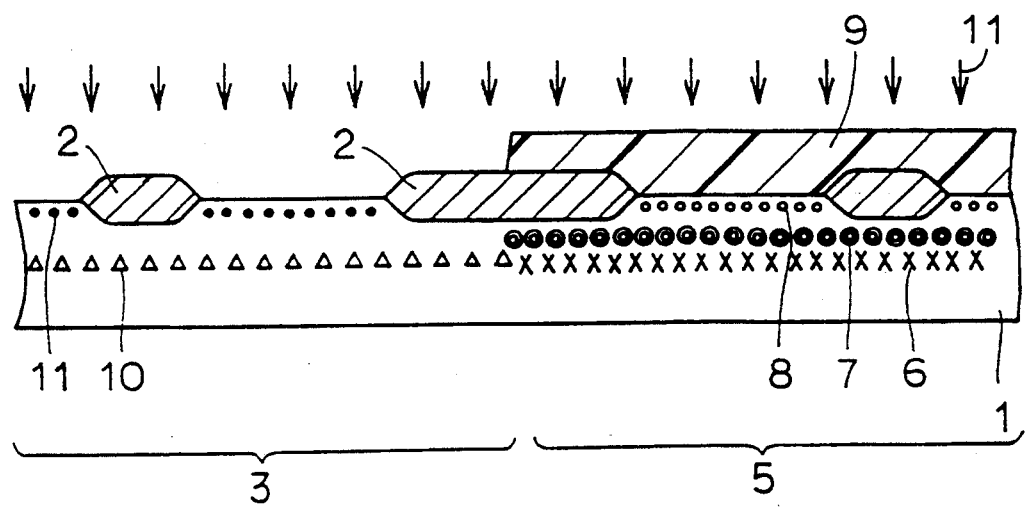
Figure 44:
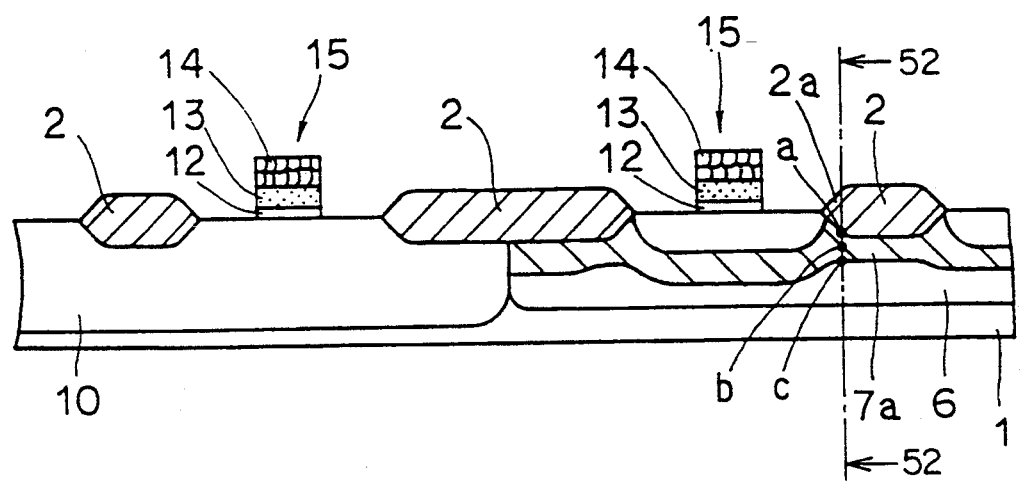
Figure 45:
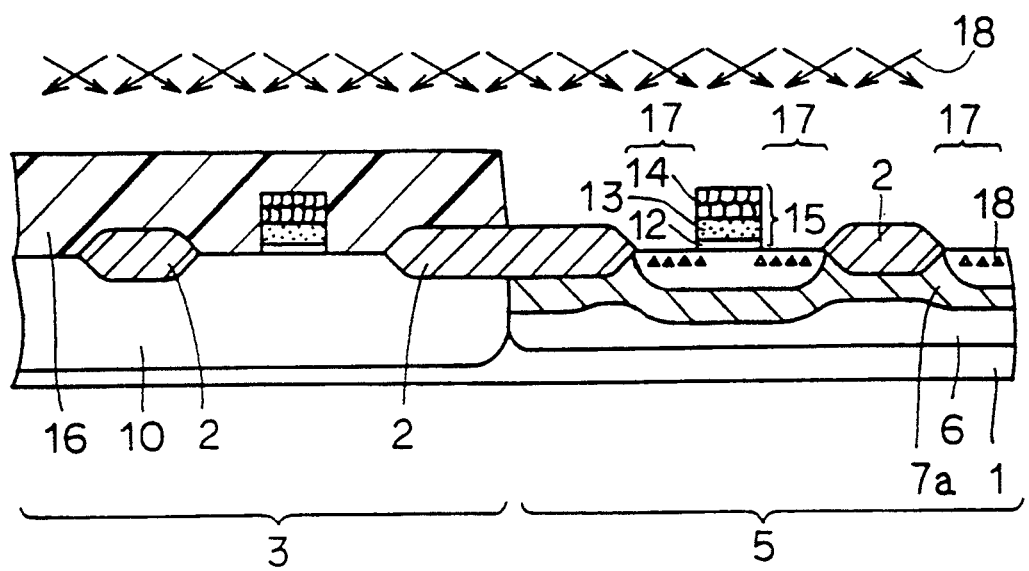
Figure 46:
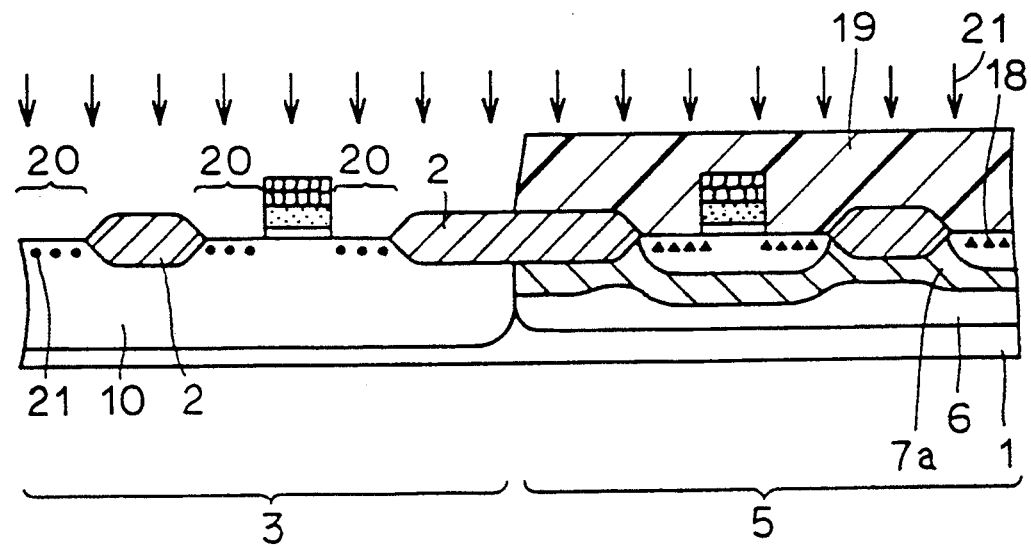
Figure 47:
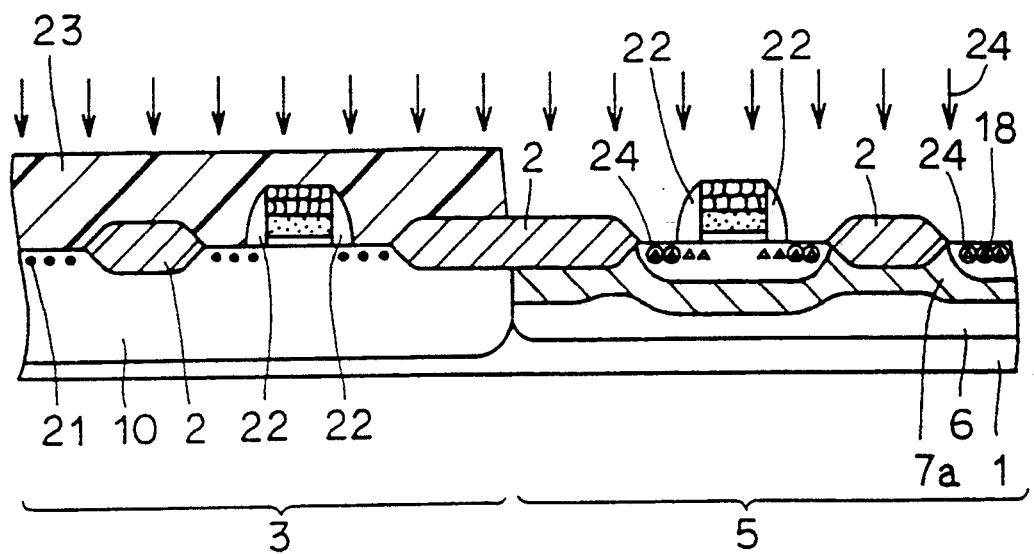
Figure 48:
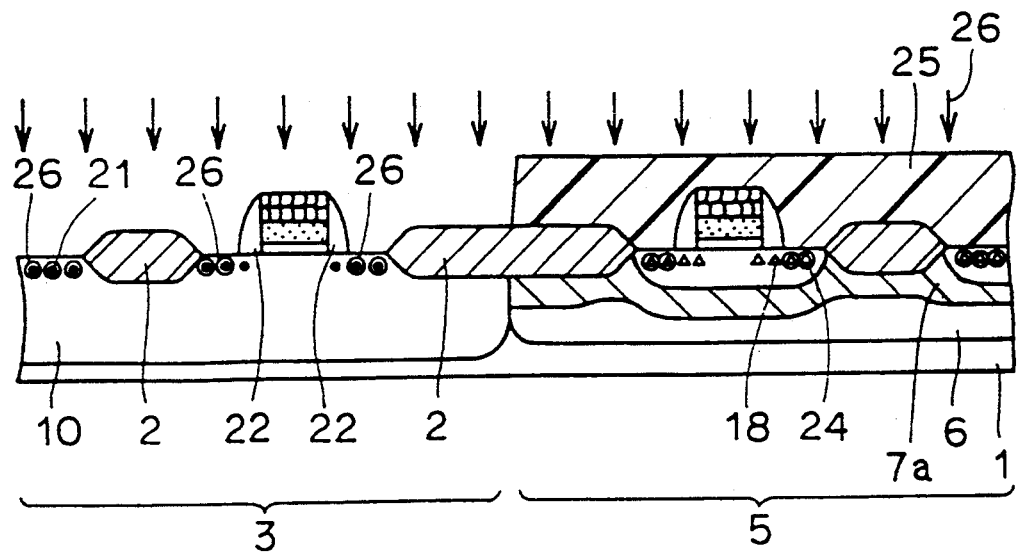
Figure 49A:
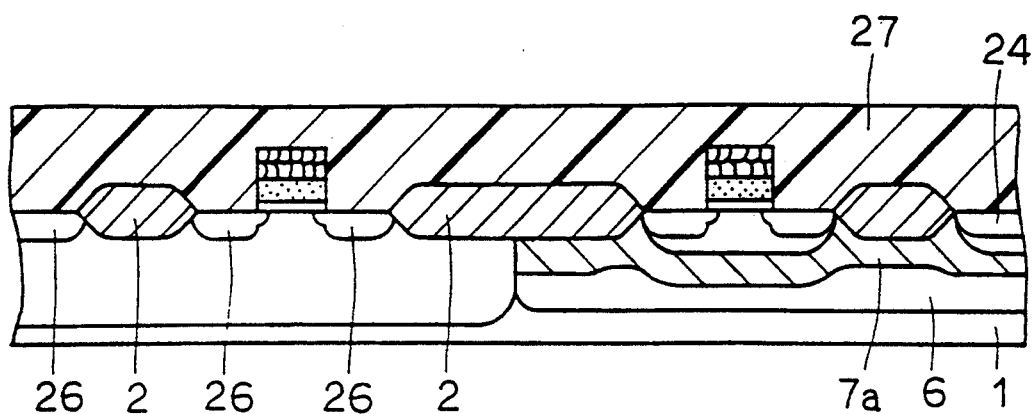
Figure 49B:
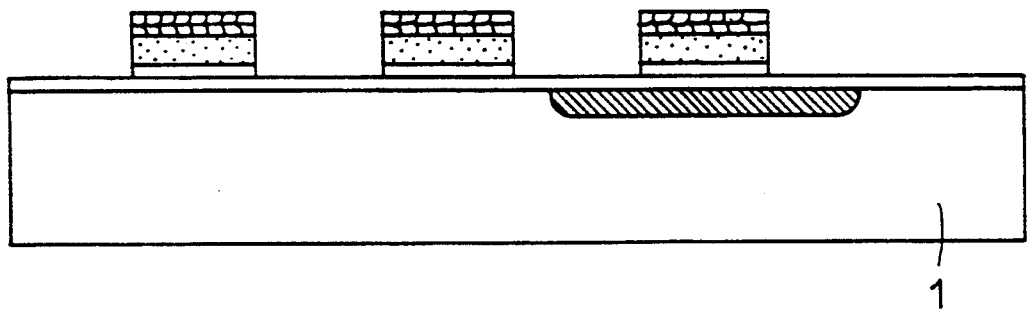
Figure 50A:
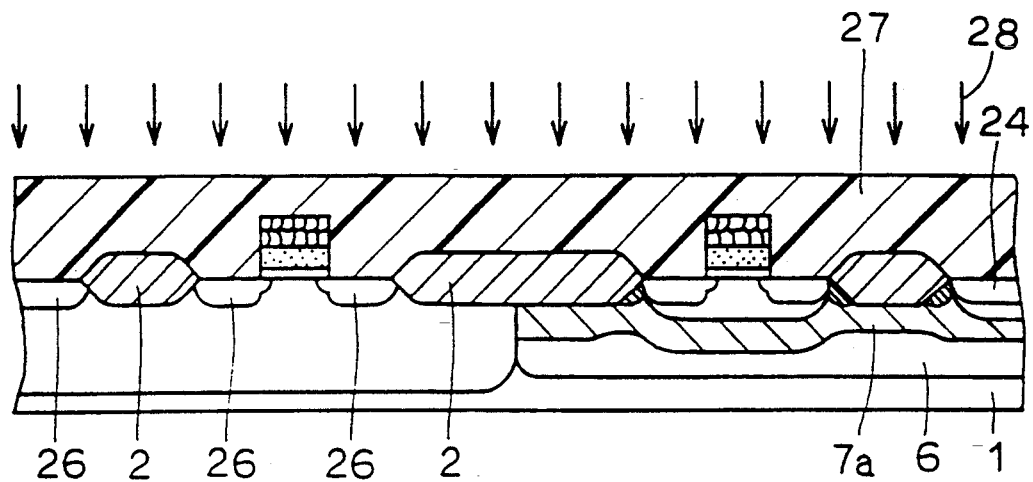
Figure 50B:
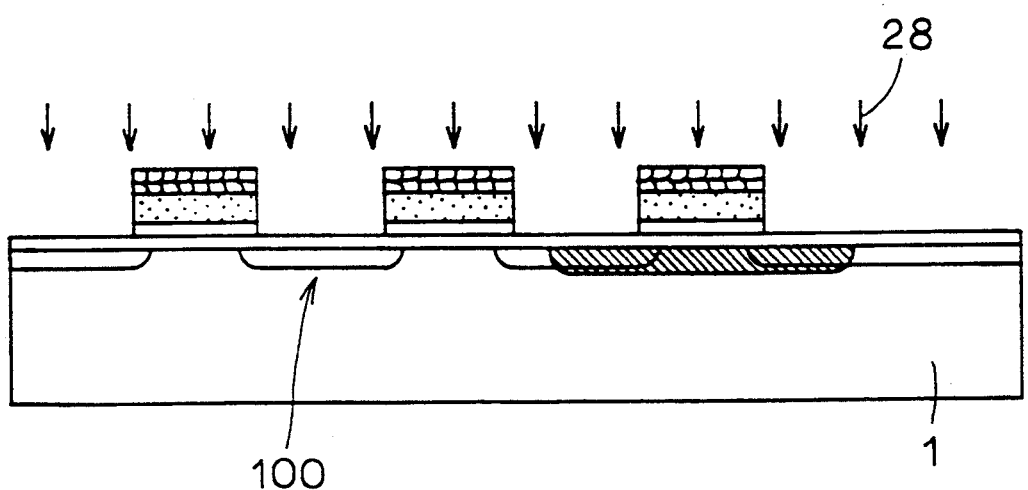
Figure 51:
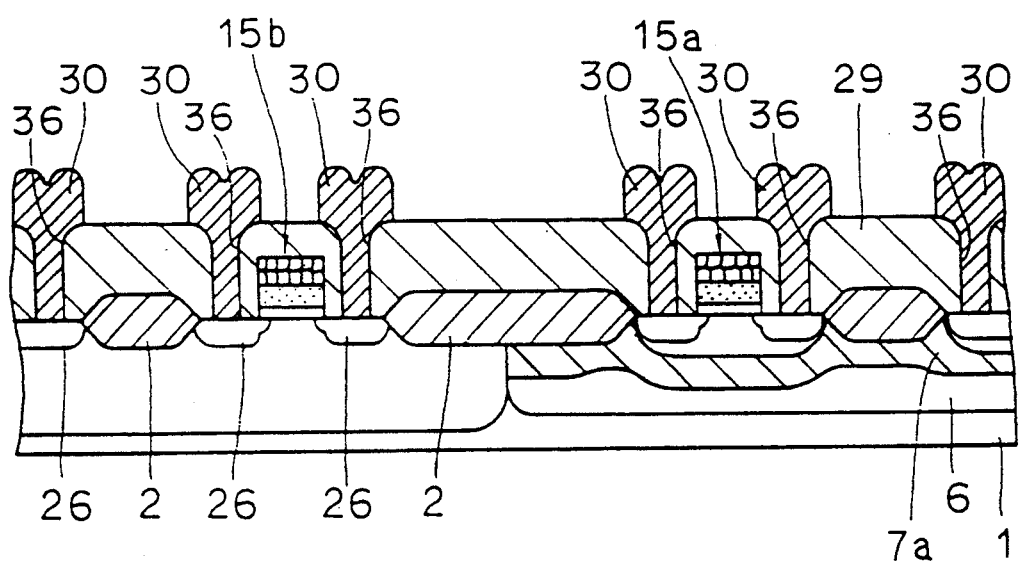
Figure 52:
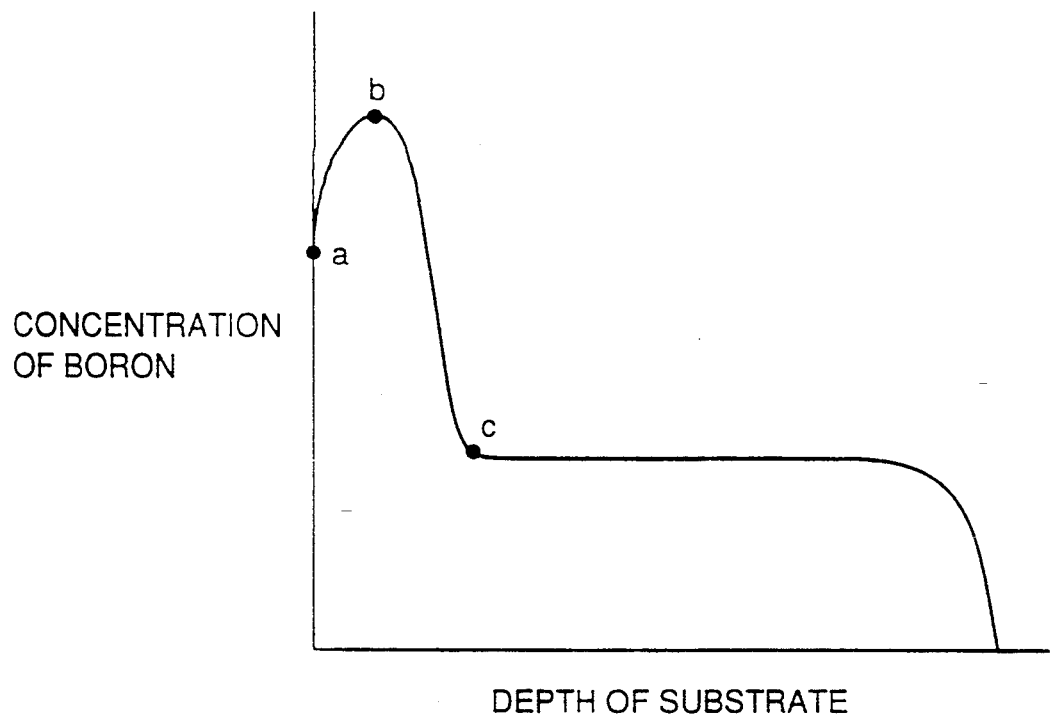
FIG. 52 is a profile of boron in the semiconductor substrate taken along line A—A in FIG. 44.
Figure 53:
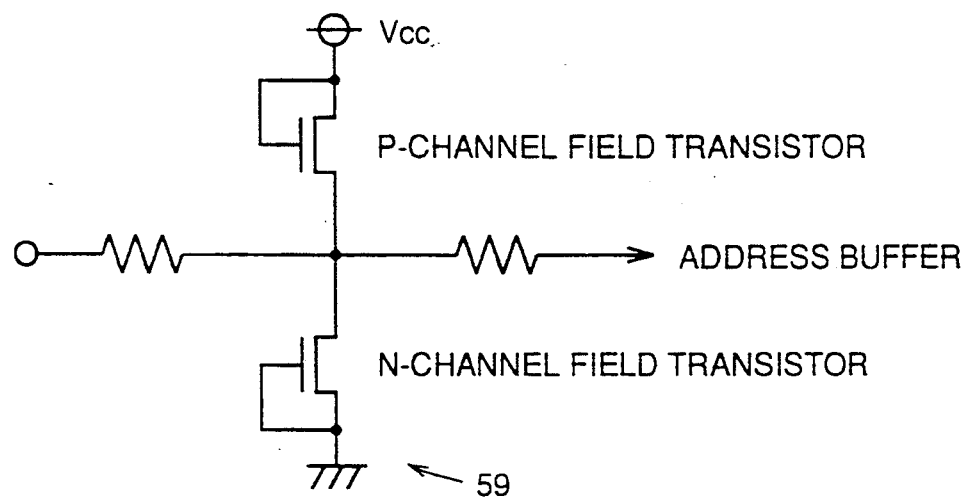
FIG. 53 is a circuit diagram of an input protection circuit.
Figure 54:
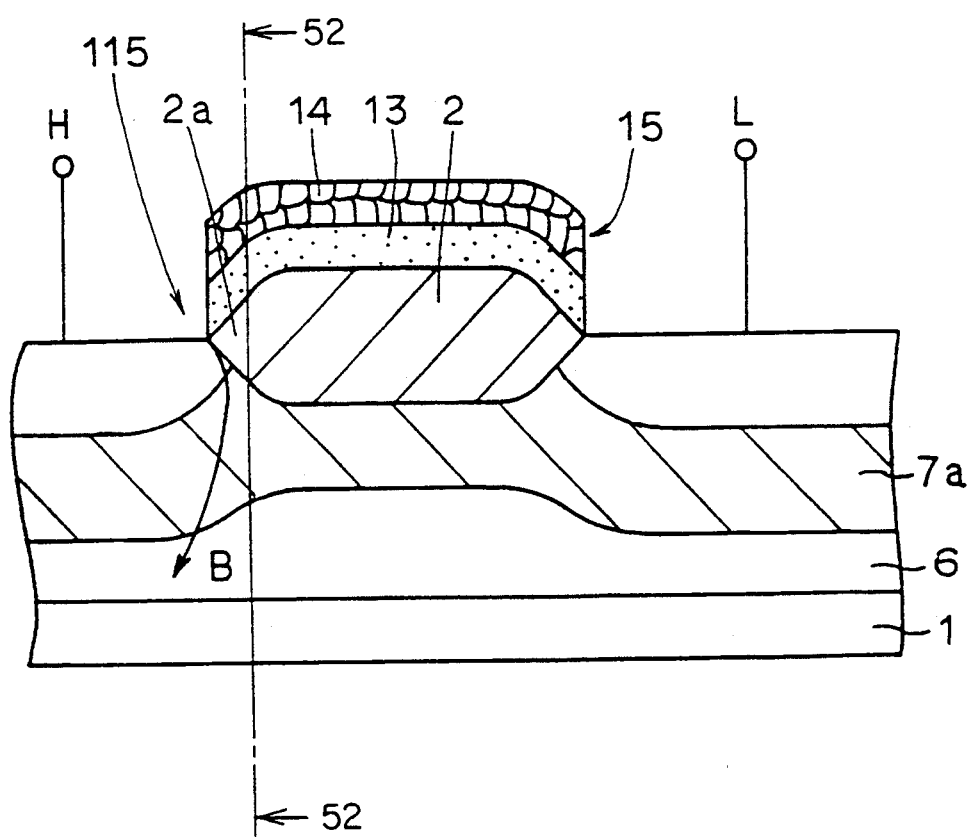
FIG. 54 is a sectional view of a conventional N-channel transistor.

FIG. 39 is a sectional view of the semiconductor device according to still another embodiment of the present invention.

Although the semiconductor substrate in which elements are isolated by a retro grade well is shown as an example in the above embodiment, the present invention is not limited thereto, and is applicable to such semiconductor device having a P+ impurity layer 51 formed directly under field oxide film 2 as shown in FIG. 39. The isolation breakdown voltage can be increased by providing P+ impurity region 34 having the P-type impurity concentration selected within the range of $1 \times 10^{17}$–$5 \times 10^{17}$ atoms/cm$^3$ directly under surrounding portion 2b of field oxide film 2.

As described above, in the semiconductor device according to the first aspect of the present invention, the isolation breakdown voltage increases, because the P+ impurity region having the concentration thicker than that of P-type impurity of the channel cut layer is formed directly under the bird's beak portion of the LOCOS oxide film in the main surface of the semiconductor substrate.

In the semiconductor device including the N-channel field transistor for forming the input protection circuit according to the second aspect of the present invention, the breakdown voltage of the N-channel field transistor increases, because the P+ impurity region having the concentration thicker than that of P-type impurity of the channel cut layer is formed directly under the bird's beak portion of the LOCOS oxide film in the main surface of the semiconductor substrate.

Also, in the method of manufacturing the semiconductor device according to the third aspect of the present invention, the N-channel transistor having the improved isolation breakdown voltage can be obtained, because the P+ impurity region having the concentration thicker than that of P-type impurity of the channel cut layer is formed directly under the bird's beak portion of the LOCOS oxide film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate having a main surface;
    a LOCOS oxide film provided in the main surface of said semiconductor substrate for surrounding an element region and isolating the element region from another element region; and
    an N-channel transistor provided in said element region,
    said LOCOS oxide film including a bird's beak portion,
    a channel cut layer having P-type impurity implanted therein being provided under said element region, and
    a P+ impurity region having a concentration greater than that of P-type impurity of said channel cut layer being formed only directly under said bird's beak portion of said LOCOS oxide film in the main surface of said semiconductor substrate.

2. The semiconductor device according to claim 1, wherein a P-well and an N-well are formed adjacent to each other in the main surface of said semiconductor substrate, said N-channel transistor is formed in said P-well, and a P-channel transistor is formed in said N-well.

3. A semiconductor device including an N-channel field transistor for forming an input protection circuit, comprising:
    a semiconductor substrate;
    a pair of N-type impurity regions formed spaced apart from each other in a main surface of said semiconductor substrate;
    a LOCOS oxide film having a bird's beak portion for surrounding and isolating said pair of N-type impurity regions; and
    a gate electrode provided on said LOCOS oxide film so as to bridge said pair of N-type impurity regions,
    a channel cut layer having P-type impurity implanted therein being further provided under said element region, and
    a P+ impurity region having a concentration greater than that of P-type impurity of said channel cut layer being formed only directly under said bird's beak portion of said LOCOS oxide film in the main surface of said semiconductor substrate.

4. A method of manufacturing a semiconductor device including an N-channel transistor and a P-channel transistor, comprising the steps of:
    forming a LOCOS oxide film including a bird's beak portion in a main surface of a semiconductor substrate;
    implanting first P-type impurity ions for channel doping into the main surface of said semiconductor substrate within an element region;
    implanting second P-type impurity ions into the main surface of said semiconductor substrate for forming a channel cut layer under said element region;
    forming said N-channel transistor on said semiconductor substrate within said element region;
    implanting third P-type impurity ions for forming P-type source/drain regions of said P-channel transistor at positions isolated from said element region in the main surface of said semiconductor substrate;
    implanting fourth P-type impurity ions for ROM determination into the main surface of said semiconductor substrate; and
    forming a P+ impurity region having a concentration greater than that of P-type impurity of said channel cut layer only directly under said bird's beak portion of said LOCOS oxide film.

5. The method of manufacturing a semiconductor device according to claim 4, wherein said step of forming the P+ impurity region is conducted simultaneously with said step of implanting the first P-type impurity ions and carried out by an oblique rotational ion implantation method.

6. The method of manufacturing a semiconductor device according to claim 4, wherein said step of forming the P+ impurity region is conducted simultaneously with said step of implanting the third P-type impurity ions.

7. The method of manufacturing a semiconductor device according to claim 4, wherein said step of forming the P+ impurity region is conducted simultaneously with said step of implanting the fourth P-type impurity ions.

* * * * *